United States Patent
Huang et al.

(10) Patent No.: US 10,590,305 B2
(45) Date of Patent: Mar. 17, 2020

(54) POLYIMIDE DRY FILM AND APPLICATION THEREOF

(71) Applicant: ETERNAL MATERIALS CO., LTD., Kaohsiung (TW)

(72) Inventors: Po-Yu Huang, Kaohsiung (TW); Chih-Min An, Kaohsiung (TW); Chung-Jen Wu, Kaohsiung (TW); Meng-Yen Chou, Kaohsiung (TW); Chang-Hong Ho, Kaohsiung (TW); Shun-Jen Chiang, Kaohsiung (TW); Chung-Kai Cheng, Kaohsiung (TW)

(73) Assignee: ETERNAL MATERIALS CO., LTD., Kaohsiung (TW)

( * ) Notice: Subject to any disclaimer, the term of this patent is extended or adjusted under 35 U.S.C. 154(b) by 0 days.

(21) Appl. No.: 15/636,993

(22) Filed: Jun. 29, 2017

(65) Prior Publication Data

US 2018/0002567 A1 Jan. 4, 2018

(30) Foreign Application Priority Data

Jul. 1, 2016 (TW) .............................. 105121072 A

(51) Int. Cl.
| | | |
|---|---|---|
| C09D 179/08 | (2006.01) | |
| B32B 37/22 | (2006.01) | |
| C08G 73/10 | (2006.01) | |
| C08G 73/12 | (2006.01) | |
| C08J 5/18 | (2006.01) | |
| H05K 3/28 | (2006.01) | |

(52) U.S. Cl.
CPC .......... *C09D 179/08* (2013.01); *B32B 37/226* (2013.01); *C08G 73/1042* (2013.01); *C08G 73/122* (2013.01); *C08J 5/18* (2013.01); *H05K 3/282* (2013.01); *H05K 3/285* (2013.01); *B32B 2309/02* (2013.01); *B32B 2310/08* (2013.01); *B32B 2457/00* (2013.01); *B32B 2457/08* (2013.01); *B32B 2457/20* (2013.01); *C08J 2379/08* (2013.01); *H05K 3/287* (2013.01); *H05K 2201/0154* (2013.01)

(58) Field of Classification Search
CPC ... C08J 5/18; C08G 73/10; H05K 2201/0154; H05K 1/036; B32B 27/281
See application file for complete search history.

(56) References Cited

U.S. PATENT DOCUMENTS

| | | | |
|---|---|---|---|
| 4,238,528 A * | 12/1980 | Angelo | .................. H01B 3/306 427/96.3 |
| 5,248,760 A | 9/1993 | DuBois et al. | |
| 8,105,752 B2 | 1/2012 | Chou et al. | |
| 8,673,540 B2 | 3/2014 | Chou et al. | |
| 8,735,534 B2 | 5/2014 | Wu et al. | |
| 8,932,801 B2 | 1/2015 | Chou et al. | |
| 9,334,369 B2 | 5/2016 | Cheng et al. | |
| 9,617,223 B2 | 4/2017 | Cheng et al. | |
| 2003/0052078 A1* | 3/2003 | Sakayori | ................ H05K 3/002 216/13 |
| 2008/0096997 A1 | 4/2008 | Wu et al. | |
| 2011/0212402 A1 | 9/2011 | Chou et al. | |
| 2015/0023054 A1* | 1/2015 | Goda | ........................ B32B 7/12 362/607 |
| 2016/0017105 A1* | 1/2016 | Wu | ....................... B32B 37/003 156/60 |

FOREIGN PATENT DOCUMENTS

| | | |
|---|---|---|
| EP | 0373005 | 11/1989 |
| TW | 200819477 A | 5/2008 |
| TW | 200821339 A | 5/2008 |
| TW | 200906910 A | 2/2009 |
| TW | 201014876 A | 4/2010 |
| TW | 201014877 A | 4/2010 |
| TW | 201024337 A | 7/2010 |
| TW | 201131290 A1 | 9/2011 |
| TW | 1383251 B | 1/2013 |
| TW | 201326136 A1 | 7/2013 |
| TW | 1535768 | 2/2016 |

OTHER PUBLICATIONS

Non-English Office Action dated Feb. 21, 2018 for Application No. TW 106219301.
Non-English Office Action dated Feb. 21, 2018 for Application No. TW 106219302.
Espacenet English abstract of TW 200819477 A.
Espacenet English abstract of TW 200821339 A.
Espacenet English abstract of TW 200906910 A.
Espacenet English abstract of TW 201024337 A.
Espacenet English abstract of TW 201326136 A1.
Espacenet English abstract of 201131290 A1.
Espacenet English abstract of TW 201014876 A.
Espacenet English abstract of TW 201014877 A.
Office Action issued in corresponding Korean Application No. 10-2017-0084137 dated Feb. 21, 2019.

* cited by examiner

*Primary Examiner* — Gregory Listvoyb
(74) *Attorney, Agent, or Firm* — Ladas & Parry LLP

(57) ABSTRACT

A polyimide dry film including a carrier and a polyimide layer and a method of using the same are provided. The polyimide layer contains (a) a polyimide precursor or soluble polyimide and (b) a solvent. The solvent includes a hydrophilic solvent and a hydrophobic solvent and a weight ratio of the hydrophilic solvent to the hydrophobic solvent is in the range of about 0.05 to about 2. The polyimide dry film of the present invention has water absorbability, is relatively stable even in the presence of water, and has a non-sticky surface. The resulting polyimide has excellent physical properties and can be used in a process in which water or an aqueous solution is involved to form a coverlay with excellent physical properties.

12 Claims, 2 Drawing Sheets

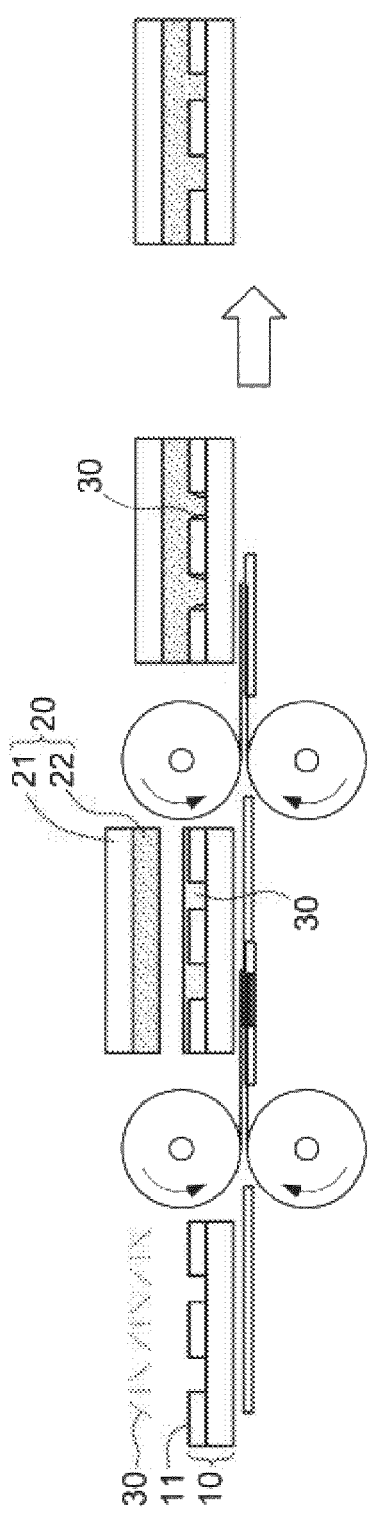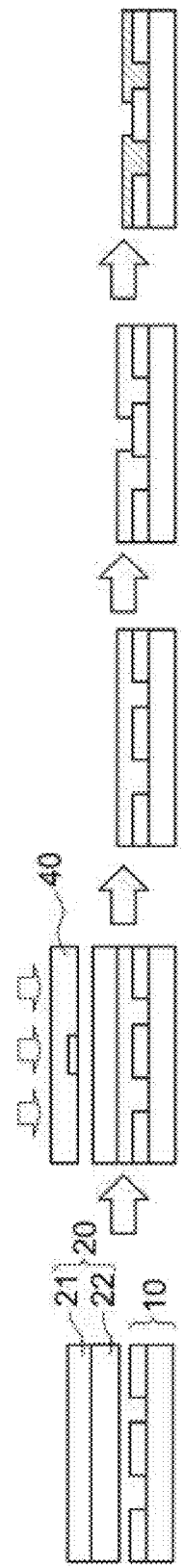

POLYIMIDE DRY FILM AND APPLICATION THEREOF

BACKGROUND OF THE INVENTION

1. Field of the Invention

The present invention relates to a polyimide dry film, particularly a polyimide dry film applicable to a wet process, and a method of using the same.

2. Description of the Related Art

In recent years, it has been emphasized that electronic products should be lighter, thinner, shorter and smaller, and thus the size of various electronic parts and components has to be reduced much more. Under such a development trend, there is more room to develop a flexible printed circuit (FPC) board which has lightness, thinness, high temperature resistance and other characteristics and may be produced abundantly. The flexible printed circuit board may be found in various electronic products which are popular nowadays, such as mobile phones, liquid crystal displays, and organic light-emitting diodes. The flexible printed circuit board is produced by arranging circuits and other electronic components on a flexible substrate, which, compared to a printed circuit board using a conventional silicon substrate or glass substrate, has better flexibility and thus may also be referred to as a soft board.

Usually, a coverlay is applied to a surface of the soft board as an insulation protection layer to protect copper circuits on the surface of the soft board and improve the bending-proof performance of the circuit. A suitable material of the coverlay is required to have belter heat resistance, dimensional stability, insulation performance, and chemical resistance.

Generally, a method for laminating a coverlay to a soft board comprises following steps: firstly processing the coverlay into a specified shape such that the overlay has openings to expose the circuits on the soft board; applying an adhesive layer to a surface of the coverlay; and then aligning the coverlay with corresponding positions of the soft board to implement lamination. However, the above method requires conducting the procedures, such as processing and openings formation on a very thin coverlay, and the lamination of the coverlay to the soft board substantially relies on manual operation. Therefore, it results in the problems, such as low yield of the process and a high cost, thus failing to satisfy requirements for high precision assembly. In addition, a problem of adhesive overflow (adhesive bleeding) exists.

In order to overcome the above problems, it has been known that a photo-imageable coverlay (PIC) may be used for improvement. The photo-imageable coverlay does not require pre-forming openings, such that the previous troublesome and complex procedure will be simplified greatly.

However, when the photo-imageable coverlay is laminated to a patterned circuit board by a dry lamination process, undesired gas may remain between the patterned circuit board and the photo-imageable coverlay, thus affecting reliability and quality of final products. In order to remove the gas between the circuit board and the photo-imageable coverlay, a high pressure degassing machine is used in some industries, to eliminate the gas bubbles produced during lamination. However, the gas bubbles are difficult to be removed completely, and may regenerate easily. Alternatively, a vacuum lamination apparatus (for example, a vacuum laminator or a vacuum hot press machine) may be used, which firstly discharges the air and is then pressurized for lamination. However, in most cases, the method that uses the vacuum lamination apparatus can only achieve lamination in a single-sheet manner, i.e., it is necessary to pause for a period of time after each lamination so as to remove a test piece that has been laminated and replace it with another test piece. The method that uses the vacuum lamination apparatus is not only time-consuming and fails to satisfy an objective of rapid production, but it is also not cost-efficient due to the high cost of the apparatus.

In a wet lamination process, a liquid (which is generally water or an aqueous solution) is applied onto a surface to be laminated firstly, to fully fill recessed areas on the surface, and thus the air that may exist between the coverlay material and the surface to be laminated can be eliminated. However, the existing photo-imageable coverlay is mainly a photo-imageable dry film solder mask (DFSM), which is mostly composed of an epoxy resin or an acrylate resin. However, the coverlay made from the epoxy resin or the acrylate resin may not be applied to high-level products due to insufficient heat resistance, insulativity, chemical resistance or mechanical strength. Furthermore, because the photo-imageable DFSM has an organic solvent content of 1 wt % or less, it is not suitable for use in a wet lamination process.

Another photo-imageable coverlay is a solvent containing dry film, for example, polyimide dry film. Although the polyimide dry film has desirable heat resistance, dimensional stability, insulativity, and chemical resistance, it is not suitable for use in a wet lamination process if the solvent used is poorly compatible with water or an aqueous solution. Moreover, polyimide and a precursor thereof (for example, polyamic acid or polyamic ester) is prone to hydrolysis, which causes chain scission or premature imidization and produces undesired low-molecular-weight polyimide precipitates, thereby affecting the quality of resulting coverlay. Accordingly, it has been considered in the art that the polyimide dry film generally needs to be stored or processed at a low-temperature or anhydrous environment and thus is not suitable for use in a wet lamination process.

Therefore, there is a need for a novel dry film in the art, which can be easily laminated onto a patterned surface without producing too much residual gas, and from which a coverlay having good heat resistance, insulativity, chemical resistance, and mechanical strength can be prepared. Further, there is also a need for a much economic and convenient lamination method in the art, by which a coverlay can be applied onto a patterned surface.

SUMMARY OF THE INVENTION

In an aspect, the present invention provides a polyimide dry film including a carrier and a polyimide layer. The polyimide layer comprises (a) a polyimide precursor or soluble polyimide; and (b) a solvent, where the solvent includes a hydrophilic solvent and a hydrophobic solvent, and the weight ratio of the hydrophilic solvent to the hydrophobic solvent is in the range of about 0.05 to about 2.

In another aspect, the present invention provides a method for applying the dry film above onto a substrate.

The polyimide dry film of the present invention can be applied onto a substrate without the use of a high pressure degassing machine or vacuum lamination apparatus as taught in the art, is suitable for use in a wet lamination process, and retains good heat resistance, dimensional stability, insulativity, and chemical resistance of a polyimide dry film. The application process is simple, the apparatus is readily available, and thus the present invention is more cost-efficient than the existing techniques.

BRIEF DESCRIPTION OF THE DRAWINGS

The invention will be described according to the appended drawings in which:

FIG. 2 is a schematic diagram of applying a dry film of the present invention in wet lamination.

FIG. 3 shows related steps of processing a dry film of the present invention for use in a coverlay.

PREFERRED EMBODIMENT OF THE PRESENT INVENTION

Figure 1:
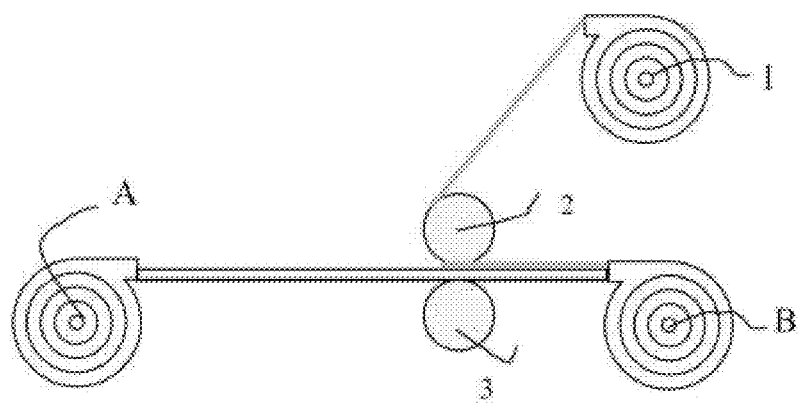
FIG. 1 is a schematic diagram of a roll-to-roll process.

In order to facilitate the understanding of the disclosure herein, the terms are hereby defined below.

The term "about" refers to an acceptable deviation of a given value measured by a person of ordinary skill in the art, depending, in part, on how to measure or determine the value.

In the present invention, the term "alkyl" refers to a saturated, straight or branched hydrocarbon group, which comprises preferably 1-30 carbon atoms, and more preferably 1-20 carbon atoms. Examples include (but are not limited to) methyl, ethyl, n-propyl, isopropyl, n-butyl, isobutyl, tert-butyl, amyl, hexyl and similar groups.

In the present invention, the term "alkenyl" refers to an unsaturated, straight or branched hydrocarbon group containing at least one carbon-carbon double bond, which comprises preferably 2-30 carbon atoms, and more preferably 10-20 carbon atoms. Examples include (but are not limited to) ethenyl, propenyl, methyl propenyl, isopropenyl, pentenyl, hexenyl, heptenyl, 1-propenyl, 2-butenyl, 2-methyl-2-butenyl and similar groups.

In the present invention, the term "alkynyl" refers to an unsaturated, straight or branched hydrocarbon group containing at least one carbon-carbon triple bond, which comprises preferably 2-30 carbon atoms, and more preferably 10-20 carbon atoms. Examples include (but are not limited to) ethynyl, propargyl, 3-methyl-1-pentynyl, 2-heptynyl and similar groups.

In the present invention, the term "aryl" or "aromatic compound" refers to a monocyclic, bicyclic or tricyclic aromatic carbocyclyl comprising a 6 to 14 carbon atoms. Examples include (but are not limited to) phenyl, tolyl, naphthyl, fluorenyl, anthryl, phenanthrenyl and similar groups.

In the present invention, the term "halogenated alkyl" refers to an alkyl substituted with a halogen, wherein the "halogen" denotes fluorine, chlorine, bromine or iodine, preferably fluorine or chlorine.

In the present invention, the term "alkoxy" refers to an alkyl attached to an oxygen atom. Examples include (but not limited to) methoxy, ethoxy, propoxy, isopropoxy, n-butoxy, isobutoxy, pentoxy, hexyloxy, benzyloxy, fluorenylmethoxy and similar groups.

In the present invention, the term "heterocyclyl" refers to a saturated, partially saturated (for example, those denominated with the prefix dihydro, trihydro, tetrahydro, hexahydro, or the like), or unsaturated 3 to 14-membered cyclyl containing carbon atoms and at least one heteroatom selected from N, O or S, preferably a 4 to 10-membered cyclyl, and more preferably a 5 or 6-membered cyclyl. The heterocyclyl preferably has 1 to 4 heteroatoms and more preferably 1 to 3 heteroatoms. The heterocyclyl may be a monocyclic, bicyclic or tricyclic ring system, including fused rings (for example, a fused ring formed together with another heterocyclic ring or another aromatic carbocyclic ring). Unless specifically indicated otherwise, in the present invention, the "heterocyclyl" may be substituted or unsubstituted. Examples of substituents include (but are not limited to) halo, hydroxyl, oxo, alkyl, hydroxyalkyl, $-NO_2$, and the like.

In the present invention, the term "nitrogen-containing heterocyclyl" refers to a 3 to 14-membered heterocyclyl with at least one ring carbon atom replaced by N, preferably a 4 to 10-membered nitrogen-containing heterocyclyl, and more preferably a 5 or 6-membered nitrogen-containing heterocyclyl. Examples include (but are not limited to) pyrrolyl, imidazolyl, pyrazolyl, pyrimidinyl, thiazolyl, pyridyl, indolyl, isoindolyl, benzimidazolyl, benzothiazolyl, quinolyl, isoquinolyl, and the like. Unless specifically indicated otherwise, in the present invention, the "nitrogen-containing heterocyclyl" may be substituted or unsubstituted. The substituents are as defined above for "heterocyclyl".

In the present invention, the term "polyimide layer" refers to a resin layer containing a polyimide resin, a polyimide precursor, or a polyetherimide (PEI) resin. The "polyimide" may be a polyimide homopolymer or copolymer.

In the present invention, the term "dry film" does not mean that the film does not contain any solvent but refers to a material present on a carrier in the form of a film as compared to a liquid material. Unlike a liquid material which is applied on to a substrate by coating, dry film is transferred to a substrate by lamination followed by removing the carrier.

The present invention provides a polyimide dry film, including a carrier and a polyimide layer. The polyimide layer comprises a polyimide precursor or soluble polyimide and a solvent. The solvent includes a hydrophilic solvent and a hydrophobic solvent, and is present in a total content of about 30 wt % to about 70 wt % based on the total weight of the polyimide layer, and the weight ratio of the hydrophilic solvent to the hydrophobic solvent is in the range of about 0.05 to about 2.

Polyimide Dry Film of the Present Invention

1. Carrier

The earner used in the present invention can be any earner known to persons having ordinary skill in the art, such as glass or plastic. The plastic carrier is not particularly limited, which includes, for example, but is not limited to, polyester resins, such as polyethylene terephthalate (PET) and polyethylene naphthalate (PEN); polymethacrylate resins, such as polymethyl methacrylate (PMMA); polyimide resins; polystyrene resins; polycycloolefin resins; polyolefin resins; polycarbonate resins; polyurethane resins; triacetate cellulose (TAC); or a mixture thereof. The preferred earner is polyethylene terephthalate, polymethyl methacrylate, polycycloolefin resin, or triacetate cellulose, or a mixture thereof. More preferably, the carrier is polyethylene terephthalate. The thickness of die carrier usually depends on the purpose of a desired electronic product and is preferably in the range from about 16 μm to about 250 μm.

2. Polyimide Layer

The polyimide dry film of the present invention is applicable to various devices, and thus the polyimide layer can be a photosensitive or non-photosensitive polyimide layer.

The polyimide layer in the dry film of the present invention may comprise a polyimide precursor or soluble polyimide.

The thickness of the polyimide layer in the dry film of the present invention is not particularly limited, is generally in the range of about 10 μm to about 60 μm, and is preferably in the range of about 20 μm to about 40 μm.

(a) Polyimide Precursor

There is no special limitation to the polyimide precursor used in the present invention, which may be well known by a person of ordinary skill in the art, such as a polyamic acid, a polyamic ester, any material capable of generating polyimide through reaction, or a mixture thereof. Various polyimide precursors have been developed in the art. For instance, those disclosed in ROC (Taiwan) Patent Application No. 095138481, No. 095141664, No. 096128743, No. 097151913 or No. 100149594, the content of which is hereby incorporated for reference in its entirety.

Polyimide precursor mainly has a repeating unit of formula (A):

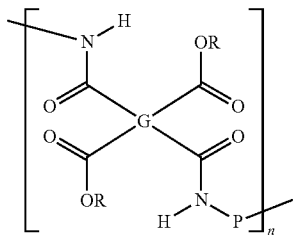

Formula (A)

wherein
G is a tetravalent organic group;
P is a divalent organic group; and
n is an integer greater than 0, and preferably an integer from 1 to 1000.

Optionally, the polyimide precursor may be modified with different substituents/groups. For example, a photosensitive polyimide precursor can be prepared by using photosensitive groups; the reactivity of a polyimide precursor or the properties of a polyimide prepared therefrom can be improved by adjusting the end groups bonded to the repeating unit of formula (A).

For example, ROC (Taiwan) Patent Application No. 100149594 discloses polyimide precursors having one of the repeating units of formulae (1) to (4):

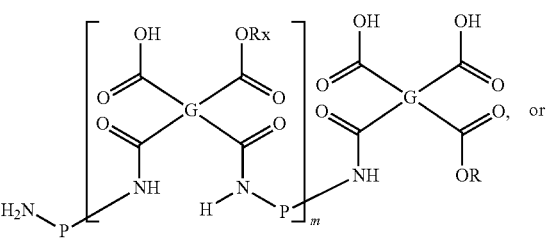

(1)

(2)

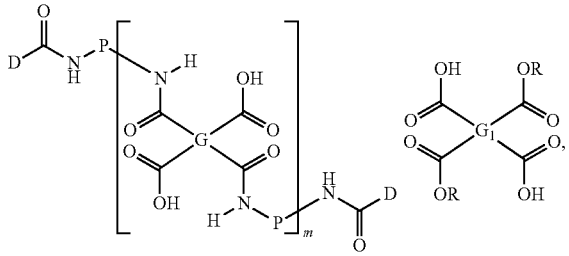

(3)

(4)

wherein $G_1$ independently represents a tetravalent organic group;
each Rx independently represents H or an ethylenically unsaturated group;
each R independently represents $C_1$-$C_{14}$ alkyl, $C_6$-$C_{14}$ aryl, $C_6$-$C_{14}$ aralkyl, a phenolic group, or an ethylenically unsaturated group;
each D independently represents a nitrogen-containing heterocyclic group or an —OR* group, wherein R* is $C_1$-$C_{20}$ alkyl;
each m is an integer from 0 to 100, preferably an integer from 5 to 50, more preferably an integer from 10 to 25; and
G and P are as defined as above.

The ethylenically unsaturated group is not particularly limited, examples thereof including, but not limited to, ethenyl, propenyl, methylpropenyl, n-butenyl, isobutenyl, ethenylphenyl, propenylphenyl, propenyloxymethyl, propenyloxyethyl, propenyloxypropyl, propenyloxybutyl, propenyl oxypentyl, propenyloxyhexyl, methylpropenyloxymethyl, methylpropenyloxyethyl, methylpropenyloxypropyl, methylpropenyloxybutyl, methylpropenyloxypentyl, methylpropenyloxyhexyl, a group of the following formula (5), and a group of the following formula (6):

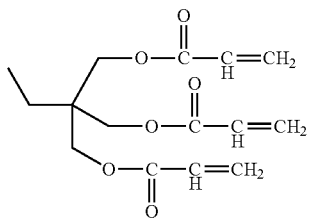

(5)

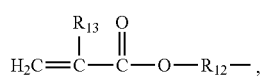

(6)

wherein $R_{12}$ is phenylene, $C_1$-$C_8$ alkylene, $C_2$-$C_8$ alkenylene, $C_3$-$C_8$ cycloalkylene or $C_1$-$C_8$ hydroxyalkylene; and $R_{13}$ is hydrogen or $C_1$-$C_4$ alkyl.

(b) Soluble Polyimide

Generally polyimide has the advantages of good heat and chemical resistance but suffers from the disadvantage of poor processability. Moreover, there are few solvents that can dissolve polyimide. Therefore, in use, a polyimide precursor is generally processed, and imidized into polyimide in a later stage of the process. Compared with polyimide, the soluble polyimide has improved structure, such that the solubility of polyimide in the solvent is increased and the processability is improved. The species of the solvent may be for example those described below.

The soluble polyimide of the present invention is not particularly limited and can be any conventional soluble polyimide known to a person of ordinary skill in the art such as those disclosed in ROC (Taiwan) Patent Application No. 097101740, No. 099105794, No. 097138725 or No. 097138792, the content of which is hereby incorporated for reference in its entirety.

The soluble polyimide of the present invention mainly has a repeating unit of formula (B):

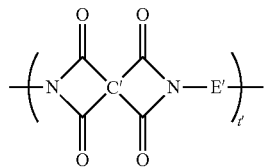

Formula (B)

wherein
C' is a tetravalent organic group;
E' is a divalent organic group; and
t' is an integer greater than 0, preferably an integer from 1 to 1000.
The tetravalent organic group C' has the same meaning as defined above for group G.
The divalent organic group E' has the same meaning as defined above for group P.

Optionally, the soluble polyimide may be modified with different substituents/groups. For example, a photosensitive polyimide can be prepared by using photosensitive groups. The properties of a soluble polyimide may be improved by adjusting the end groups bonded to the repeating unit of formula (B).

Modified soluble polyimide obtained by adjusting the end groups bonded to the repeating unit of formula (B) includes, but is not limited to,

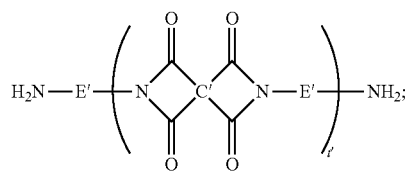

(1')

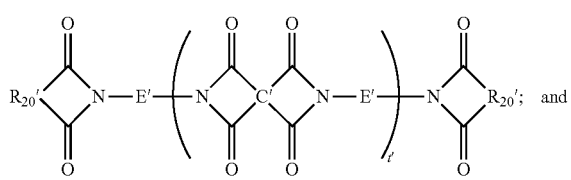

(2') and

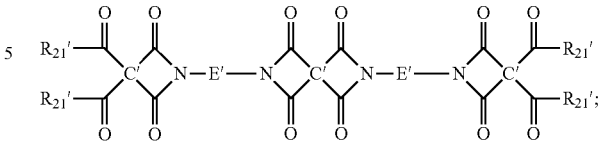

(3')

wherein
$R_{20}'$ is a saturated or unsaturated $C_2$-$C_{20}$ divalent organic group, preferably —C=C—,

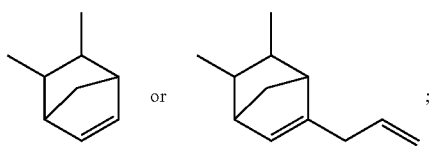

or $R_{21}'$ is an unsaturated $C_2$-$C_{20}$ monovalent organic group which may be substituted by a heteroatom, or a —OH group; and
C', E' and t' are as defined above.

Preferably, the soluble polyimide modified by photosensitive groups includes, but is not limited to, those disclosed in ROC (Taiwan) Patent Application No. 099105794, No. 097138725, or No. 097138792.

3. Solvent

Generally, the polyimide precursor and soluble polyimide are prepared or formulated in a polar aprotic organic solvent.

In the prior art, in order to prevent the dry film from generating a volatile organic compound in a high concentration during usage of the dry film and to reduce the phenomenon of excessive glue (bleeding) caused by the flowing of the coated glue (i.e., the resin layer) during storage of the dry film, a semi-product of the dry film that has been coated with the resin layer is sent to an oven for drying the resin layer and fully adhering the resin layer to the carrier. The organic solvent is almost completely volatilized at this step. Therefore, the content of the organic solvent in conventional dry film products is generally less than 1 wt %. In addition, the dry film product needs to be stored in a low-temperature environment, to reduce hydrolysis.

Different from the prior art, the dry film of the present invention may contain a solvent, and it was found by the present inventors after extensive research and repeated experiments that by controlling the species and proportion of the solvents, the resulting polyimide dry film has water absorbability, be relatively stable even in the presence of water, and have a non-sticky surface and excellent transferability, and the polyimide obtained therefrom by curing has good physical properties. Therefore, the storage stability of the dry film is increased, and the dry film is applicable to a process in which water or an aqueous solution is involved.

The solvent of the present invention includes a hydrophilic solvent and a hydrophobic solvent, wherein the weight ratio of the hydrophilic solvent to the hydrophobic solvent is in the range of about 0.05 to about 2, preferably in the range of about 0.1 to about 1, and more preferably in the range of about 0.25 to about 0.8. The resulting dry film has water absorbability, excellent transferability, non-sticky surface, stable properties, and good physical properties. When the weight ratio of the hydrophilic solvent to the hydrophobic solvent is too low (for example, lower than 0.05), the water absorbability of the polyimide dry film is poor, and the polyimide layer has poor adhesion to the substrate. When the weight ratio of the hydrophilic solvent to the hydrophobic solvent is too high, and particularly greater than 2, the surface of the dry film trends to be sticky, the operability is poor, the position alignment is difficult, and it is unfavorable to reprocessing.

The hydrophilic solvent added in the present invention is miscible with a liquid (water or an alcohol). The hydrophilic solvent useful in the present invention includes dimethyl sulfoxide (DMSO), diethyl sulfoxide, N,N-dimethyl-formamide (DMF), N,N-diethyl-form amide, N,N-dimethylacetamide (DMAc), N,N-diethylacetamide, N-methyl-2-pyrrolidone (NMP), N-ethyl-2-pyrrolidone (NEP), N-propyl-2-pyrrolidone, N-vinyl-2-pyrrolidone, phenol, o-cresol, m-cresol, p-cresol, xylenol, halogenated phenol, pyrocatechol, tetrahydrofuran (THF), dioxane, dioxolane, propylene glycol monomethyl ether (PGME), tetraethylene glycol dimethyl ether (TGDE), 2-butoxyethanol, γ-butyrolactone (GBL), xylene, toluene, hexamethylphosphoramide, propylene glycol monomethyl ether acetate (PGMEA) or a mixture thereof.

According to an embodiment of the present invention, the hydrophilic solvent used preferably includes diethyl sulfoxide, N,N-dimethyl-formamide, N,N-diethyl-formamide, N,N-dimethylacetamide, N,N-diethylacetamide, N-methyl-2-pyrrolidone, N-ethyl-2-pyrrolidone, N-propyl-2-pyrrolidone, propylene glycol monomethyl ether, γ-butyrolactone, propylene glycol monomethyl ether acetate, or a mixture thereof; and, more preferably, includes N,N-dimethyl-formamide, N-methyl-2-pyrrolidone, N-ethyl-2-pyrrolidone, γ-butyrolactone, or a mixture thereof.

The addition of a hydrophobic solvent in the present invention can increase the stability of the dry film against water, and enable the dry film to have a non-sticky surface and better operability. The hydrophobic solvent useful in the present invention includes:

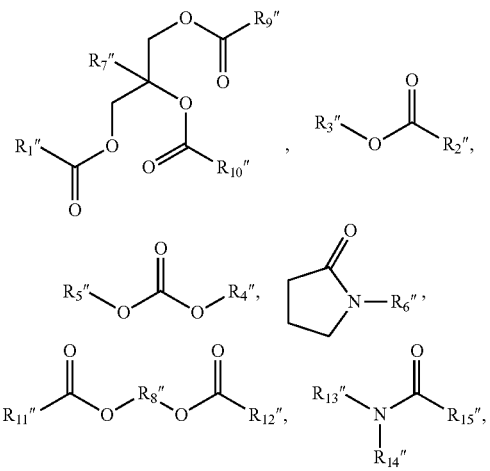

or a combination thereof wherein:
$R_1''$, $R_9''$, and $R_{10}''$ each independently represent $C_1$-$C_{20}$ alkyl, $C_2$-$C_{20}$ alkenyl, or $C_2$-$C_{20}$ alkynyl;
$R_7''$ is H or $C_1$-$C_3$ alkyl;
$R_2''$ is $C_1$-$C_{10}$ alkyl;
$R_3''$ is $C_4$-$C_{20}$ alkyl or —$C_2$-$C_{10}$ alkyl-O—$C_2$-$C_{10}$ alkyl;
$R_4''$ and $R_5''$ each independently represent $C_1$-$C_{10}$ alkyl, or $R_4''$ and $R_5''$, together with the oxygen atoms to which they are attached, form a 5 to 6-membered heterocyclic ring;

$R_6''$ is $C_4$-$C_{15}$ alkyl, $C_4$-$C_8$ cycloalkyl, or

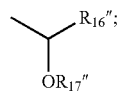

$R_8''$ is $C_2$-$C_{10}$ alkylene;
$R_{11}''$ and $R_{12}''$ each independently represent $C_1$-$C_{10}$ alkyl;
$R_{13}''$ and $R_{14}''$ each independently represent $C_1$-$C_{10}$ alkyl, or $R_{13}''$ and $R_{14}''$ together with the nitrogen atom to which they are attached, form a 5 to 6-membered heterocyclic ring;
$R_{15}''$ is $C_4$-$C_{15}$ alkyl or $C_4$-$C_8$ cycloalkyl;
$R_{16}''$ is $C_1$-$C_4$ alkyl; and
$R_{17}''$ is $C_4$-$C_{10}$ alkyl.

According to an embodiment of the present invention, the hydrophobic solvent used preferably includes:

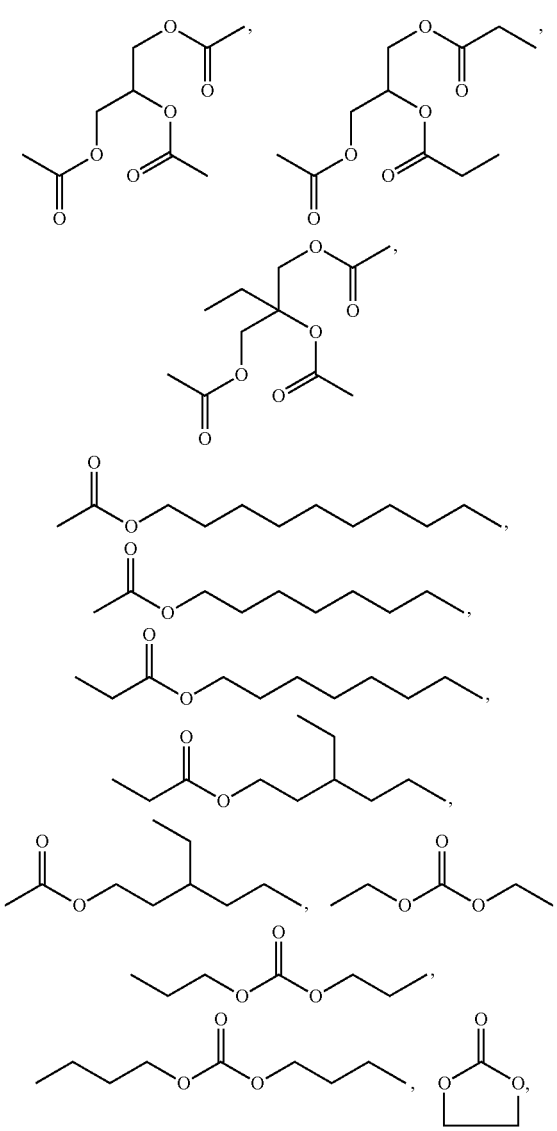

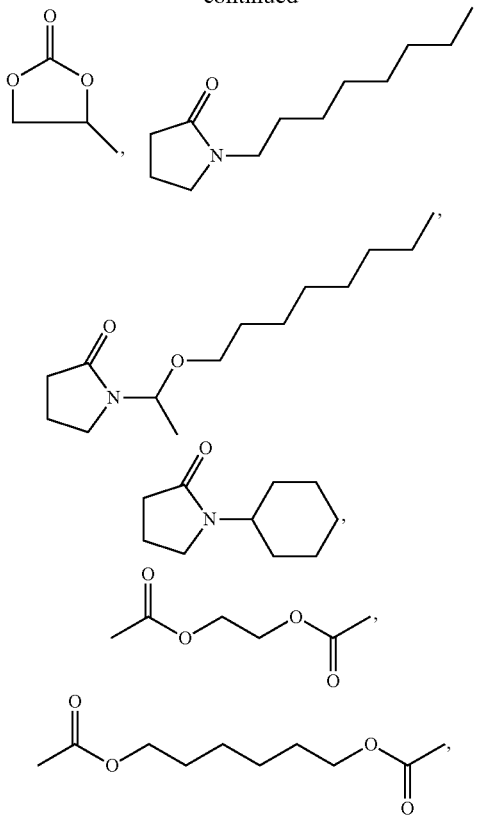

N,N-dimethylcapramide (DMC), or a combination thereof.

In the present invention, the total content of the solvent is not particularly limited and may be adjusted depending on the needs in the preparation procedure of the dry film or the subsequent processing process. In an embodiment of the present invention, the total content of the solvent is in the range of about 30 wt % to about 70 wt %, preferably in the range of about 35 wt % to about 65 wt %, and more preferably in the range of about 40 wt % to about 60 wt %, based on the total weight of the polyimide layer.

4. Additives

The polyimide layer of the present invention may optionally contain any suitable additives conventionally known to persons of ordinary skill in the art, which for example, but are not limited to, a stabilizer, a ring closing promoter, a leveling agent, a deforming agent, a coupling agent, a catalyst, an acrylate monomer, and a photoinitiator. The content of the additives can also be adjusted by persons of ordinary skill in the art after routine experiments.

In an embodiment of the present invention, the polyimide layer of the present invention may optionally contain a stabilizer selected from:

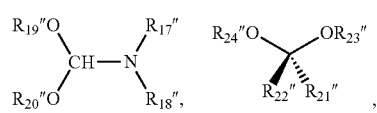

or a combination thereof, wherein:

$R_{17}''$, $R_{18}''$, $R_{19}''$ and $R_{20}''$ each independently represent H, $C_1$-$C_4$ alkyl or $C_6$-$C_{14}$ aryl, or $R_{19}''$ and $R_{20}''$, together with the oxygen atoms to which they are attached, form a 5 to 6-membered heterocyclic ring, or $R_{19}''$ and $R_{17}''$ or $R_{20}''$ and $R_{18}''$, together with the oxygen atom and nitrogen atom to which they are attached, form a 5 to 6-membered heterocyclic ring, or $R_{17}''$ and $R_{18}''$, together with the nitrogen atom to which they are attached, form a 5 to 6-membered heterocyclic ring;

$R_{21}''$ and $R_{22}''$ each independently represent $C_1$-$C_4$ alkyl, or $R_{21}''$ and $R_{22}''$, together with the carbon atom to which they are attached, form a 5 to 6-membered carbocyclic ring; and $R_{23}''$ and $R_{24}''$ each independently represent $C_1$-$C_4$ alkyl.

According to a preferred embodiment of the present invention, the stabilizer preferably includes:

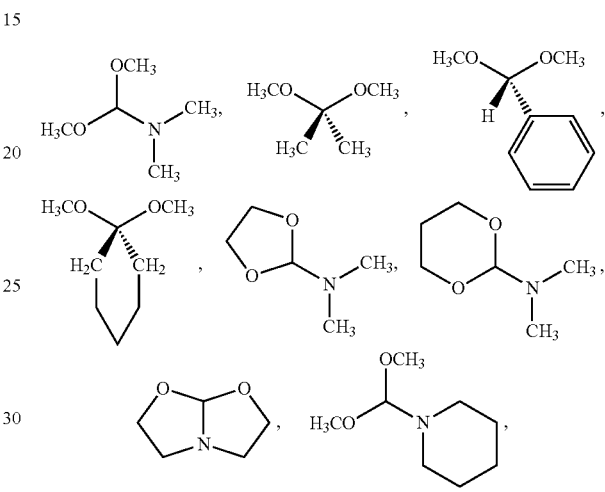

or a combination thereof.

Addition of the stabilizer is beneficial to increase the stability and operability of the dry film and further improves the physical properties of polyimide formed subsequently. In an embodiment of the present invention, the total content of the stabilizer is in the range of about 0.01 wt % to about 5 wt %, and preferably in the range of about 0.05 wt % to about 3 wt %, based on the total weight of the polyimide layer. If the content is greater than 5 wt %, the physical properties (for example, flexibility) of the formed polyimide may deteriorate.

In an embodiment of the present invention, the polyimide layer is a photosensitive polyimide, and the optional additives include a photoinitiator, and an acrylate monomer.

The photoinitiator may be used alone or in admixture of more than one photoinitiator. The photoinitiator useful in the present invention generates a free radical under light irradiation and initiates a polymerization through the transfer of the free radical. There is no special limitation to the photoinitiator useful in the present invention. Preferably, the photoinitiator used comprises a compound capable of generating a free radical through absorbing the light with a wavelength of about 350 nm to about 500 nm.

The amount of the photoinitiator is about 0.01 parts by weight to about 20 parts by weight, and preferably about 0.05 parts by weight to about 5 parts by weight based on 100 parts by weight of the solid content of the polyimide precursor or soluble polyimide. The photoinitiator suitable for the present invention may be, for example, selected from a group consisting of benzophenone, benzoin, 2-hydroxy-2-methyl-1-phenyl propanone, 2,2-dimethoxy-1,2-diphenylethan-1-one, 1-hydroxy-cyclohexyl-phenyl ketone, 2,4,6-trimethylbenzoyldiphenylphosphine oxide, oxime ester, 2,4, 6-trimethylbenzoyl diphenyl phosphine oxide, bis-4,4'-diethylaminobenzophenone, camphorquinone, 3,5-bis (diethylaminobenzylidene)-N-methyl-4-piperidone, 3,5-bis (dimethylaminobenzylidene)-N-methyl-4-piperidone, 3,5-bis (diethylaminobenzylidene)-N-ethyl-4-piperidone, 3,3'-carbonyl-bis(7-diethylamino)cumarin, 3,3'-carbonyl-bis(7-dimethylamino)cumarin, riboflavin tetrabutyrate, 2-methyl-1-[4-(methylthio)phenyl]-2-morpholinopropan-1-one, 2,4-dimethylthioxanthone, 2,4-diethylthioxanthone, 2,4-diisopropylthioxanthone, 3,5-dimethylthioxanthone, 3,5-diisopropylthioxanthone, 1-phenyl-2-(ethoxycarbonyl) oxyiminopropan-1-one, benzoin ether, bezoin isopropyl ether, benzanthrone, 5-nitroacenaphthene, 2-nitrofluorene, anthrone, 1,2-benzanthraquinone, 1-phenyl-5-mercapto-1H-tetrazole, thioxanthen-9-one, 10-thioxanthenon, 3-acetylindole, 2,6-di(p-dimethylaminobenzal)-4-carboxycyclohexanone, 2,6-di(p-dimethylaminobenzal)-4-hydroxycyclohexanone, 2,6-di(p-diethylaminobenzal)-4-carboxcyclohexanone, 2,6-di(p-diethylaminobenzal))-4 hydroxycyclohexanone, 4,6-dimethyl-7-ethylaminocumarin, 7-diethylamino-4-methylcumarin, 7-diethylamino-3-(1-methylbenzoimidazolyl) cumarin, 3-(2-benzoimidazolyl)-7-diethylaminocumarin, 3-(2-benzothiazolyl)-7-diethylaminocuramin, 2-(p-dimethylaminostyryl) benzooxazole, 2-(p-dimethylaminostyryl)quinoline, benzothiazole, 2-(p-dimethylaminostyryl)-3,3-dimethyl-3H-indole and a combination thereof. The preferred photoinitiator is benzophenone, 2,4,6-trimethylbenzoyl diphenyl phosphine oxide, benzoin, 2-hydroxy-2-methyl-1-phenyl propanone, 2,2-dimethoxy,1,2-diphenylethan-1-one, 1-hydroxy-cyclohexyl-phenyl ketone, 2,4,6-trimethylbenzoyl diphenyl phosphine oxide, oxime ester, or a combination thereof.

The aforementioned acrylate monomer is an acrylate monomer containing at least one —OC— bond, preferably a multi-functional acrylate monomer containing two or more —C═C— bonds. The addition of such monomer may form cross-linking between molecules and improve practicability of the composition. Preferably, an acrylate monomer selected from the following groups can be used in the present invention: ethylene glycol dimethacrylate, ethylene glycol diacrylate, bisphenol A ethylene glycol-modified diacrylate, bisphenol A ethylene glycol-modified dimethacrylate, bisphenol F ethylene glycol-modified diacrylate, bisphenol F ethylene glycol-modified dimethacrylate, propylene glycol dimethacrylate, tripropylene glycol diacrylate, ethoxylated trimethylolpropane triacrylate, dipentaerythritol hexaacrylate, trimethylolpropane triacrylate, trimethylolpropane trimethylacrylate, pentaerythritol triacrylate, pentaerythritol trimethylacrylate and a combination thereof. When an acrylate monomer exists, based on 100 parts by weight of the solid content of the polyimide precursor or soluble polyimide, the amount of the acrylate monomer added is about 5 to about 80 parts by weight, and preferably about 10 to about 40 parts by weight.

The coupling agent useful in the present invention may be selected from a group consisting of (but not limited thereto): 3-aminopropyltrimethoxysilane (APrTMOS), 3-triaminopropyltriethoxysilane (APrTEOS), 3-aminophenyltrimethoxysilane (APTMOS), 3-aminophenyltriethoxysilane (APTEOS), and a combination thereof.

According to an embodiment of the present invention, a ring closing promoter is optionally added during the preparation process of the polyimide precursor of the present invention. Preferably, a ring closing promoter is selected from the one that can produce an alkaline compound upon heating, to provide an alkaline environment for promoting the progress of imidization. The ring closing promoter useful in the present invention includes:

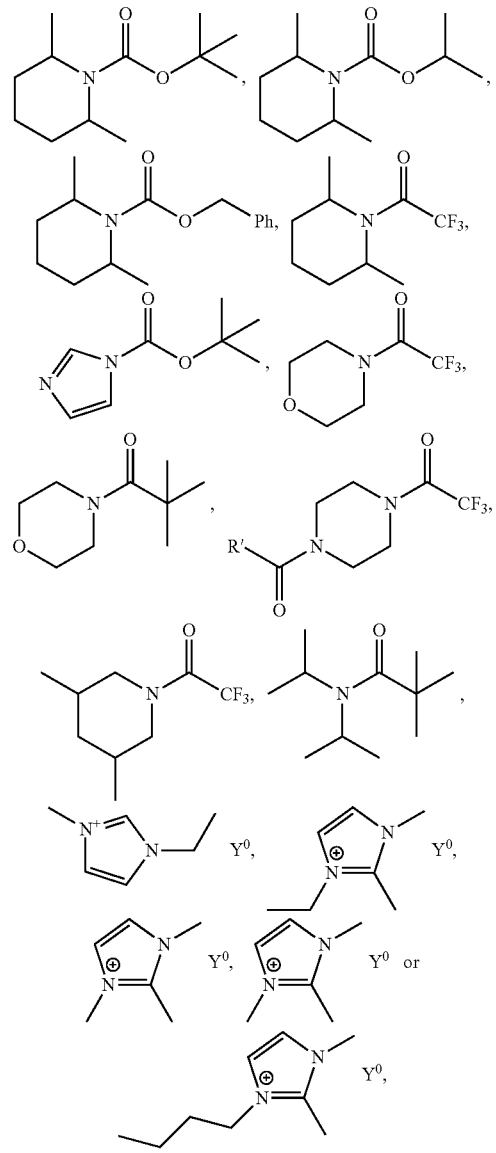

wherein $Y^\ominus$ is an anionic group.

Method for Forming a Dry Film

The polyimide dry film of the present invention may be prepared by for example the following steps:
(1) preparing a polyimide formulation, containing a polyimide precursor or soluble polyimide and a hydrophilic solvent;
(2) adding a suitable amount of a hydrophobic solvent and optional additives to the formulation;
(3) applying the formulation obtained in step (2) onto a carrier, to form a dry film semi-product;
(4) pulling the dry film semi-product into an oven to remove a portion of the solvent upon heating and drying so as to adjust the content of the solvent in the polyimide layer and form a polyimide dry film; and
(5) optionally, applying a protection film on the polyimide dry film.

In step (4), the heating temperature and lime are not particularly limited. The purpose of this step is to reduce the solvent content in the resin layer. For example, the heating and drying may be conducted at a suitable temperature between 60 to 150° C. for 30 seconds to 10 minutes. In a conventional process for preparing the dry film, in order to prevent the dry film from generating a volatile organic compound in a high concentration during usage of the dry film, the solvent is almost completely volatilized by heating (to a content of less than 1 wt %) in a solvent removal step corresponding to step (4) above. However, in contrast to the conventional step, the solvent is not completely removed in this step in the present invention, and a suitable proportion of the hydrophilic and hydrophobic solvents is retained in the dry film.

The solvent in step (4) includes a hydrophilic solvent and a hydrophobic solvent. Generally, due to the difference in boiling points of different solvents, the total amount and proportion of the solvents in the intended dry film can be controlled by properly adjusting the heating temperature and time. For example, the weight ratio of the hydrophilic solvent to the hydrophobic solvent can be adjusted to between about 0.05 to about 2.

The protection film in step (5) includes, for example, but is not limited to polyester resins, for example, polyethylene terephthalate (PET) or polyethylene naphthalate (PEN); polymethacrylate resins, for example, polymethyl methacrylate (PMMA); polyimide resins; polystyrene resins; polycycloolefin resins; polyolefin resins; polycarbonate resins; polyurethane resins; triacetate cellulose (TAG); or a mixture thereof. Preferably, the protection film is polyethylene terephthalate, polymethyl methacrylate, polycycloolefin resins, triacetate cellulose or a mixture thereof. More preferably, the protection film is polyethylene terephthalate.

Method for Applying a Dry Film on a Substrate

The present invention farther provides a method for applying a polyimide dry film onto a substrate, comprising: after removing an optional protection film, laminating the polyimide dry film onto the substrate in a manner that the polyimide layer faces the substrate. The substrate may include a printed circuit board, a wafer, glass, a display, a touch panel or the like. According to an embodiment of the present invention, the substrate is a printed circuit board, and particularly preferably a flexible printed circuit (FPC) board; and the polyimide layer of the dry film is laminated to the patterned surface.

The dry film may be applied onto the substrate in any manner, and preferably in a roll-to-roll manner. A roll-to-roll operation, which is known to a person of ordinary skill in the art, refers to the steps of drawing out a sample from a rolled-up material, processing the sample, and winding the processed sample in a roller. For example, as shown in FIG. 1, a substrate A is drawn out from a roll of the substrate A, laminated with a dry film from a dry film roll 1 by using rollers 2 and 3, and then wound to form a product B. The dry film of the present invention may be laminated to the substrate by a continuous process, which is favorable for simplifying the process and speeding up the process. The above lamination process includes, for example, but is not limited to, roller lamination, hot press, vacuum lamination, vacuum press, or wet lamination.

As described above, by properly controlling the species and proportion of the solvents, the polyimide dry film of the present invention has water absorbability and non-sticky surface, and the coverlay formed therefrom has excellent physical properties. In addition, even in the presence of water, the dry film is stable, and the property of the obtained polyimide is not affected, and therefore, the dry film is applicable to a wet lamination process and the conformability of the dry film to a patterned substrate can be increased by wet lamination.

FIG. 2 is a schematic diagram of the application of a dry film of the present invention in wet lamination. As shown in FIG. 2, the present invention provides a method for applying a dry film onto a substrate by wet lamination. The method includes:

(1) applying liquid 30 on a surface 11 to be laminated of a substrate 10; and
(2) laminating a polyimide dry film 20 of the present invention 20 (including a carrier 21 and a polyimide layer 22) onto the surface 11 of the substrate 10 in a manner that the polyimide layer faces the surface 11.

The liquid used in step (1) includes water, an alcohol solvent, or a combination thereof, to make the process more environmentally friendly and economic. The preferred liquid is methanol, ethanol, isopropanol, butanol, water, or a mixture thereof. The liquid may be filled into the recessed areas of the surface 11 to be laminated, to form a layer of liquid film, thereby expelling the air previously existing in the recessed areas.

In step (2), the dry film 20 is laminated by a roller onto the surface 11 of the substrate 10. The liquid used in step (1) can be absorbed into the polyimide layer of the present invention. Step (2) is preferably conducted by heating, for example, at a temperature of 60° C. to 100° C., to enhance the conformability and adhesion of the polyimide layer to the surface to be laminated.

A standing step (3) is optionally performed, for example, when there is liquid remaining. The remaining liquid can be fully absorbed into the dry film by standing for a period of time (for example, 5 to 240 min) after lamination.

The present invention further provides a system for wet lamination, including:

(1) the dry film of the present invention;
(2) a substrate; and
(3) a liquid.

The substrate and liquid are as described above.

The dry film of die present invention has good conformability particularly when used in a wet process, and it can effectively fill thick copper circuits compared with a conventional dry film.

Application of the Dry Film of the Present Invention

The polyimide dry film of the present invention may be laminated to a substrate, such as a printed circuit board, a wafer, glass, a display or a touch panel, by using general lamination techniques (particularly wet lamination), without the use of a high pressure degassing machine or a vacuum lamination apparatus. Therefore, compared with the prior art, the lamination of the dry film of the present invention can be carried out through simpler steps and by using an apparatus that is more easily available. Accordingly, the present invention is more cost-efficient than the prior art which adopts a vacuum lamination apparatus or other process apparatuses.

The dry film of the present invention is applicable to printed circuit boards, and serves as a coverlay for protecting the coatings on the printed circuit boards. The dry film of the present invention is electrically insulated, can protect the circuits and achieves excellent effects such as the prevention of circuit oxidation and solder short. Moreover, the dry film of the present invention has high resolution, a high developing rate, electrolysis plating resistance, electroless plating resistance, high temperature endurance, and high humidity endurance, etc. Therefore, the dry film of the present invention can also be used in a wafer process as a photoresist.

In addition, the polyimide dry film of the present invention is relatively stable even in the presence of water and has a non-sticky surface with good transferability. Moreover, the moisture or solvent in the dry film can be removed in a subsequent process without affecting the physical properties of the resulting polyimide. Therefore, the polyimide dry film is particularly advantageous when used as a coverlay. In view of this, in a preferred embodiment of the present invention, the polyimide dry film of the present invention is applied to a substrate as a coverlay by using a wet process.

FIG. 3 further illustrates subsequent processing steps by way of example in which a photosensitive polyimide dry film of the present invention is used as a coverlay for a printed circuit board. The steps include, but are not limited to:

(1) laminating the polyimide dry film 20 of the present invention onto the substrate 10 by wet lamination;
(2) performing exposure in the presence of a mask 40, to crosslink photosensitive groups (for example, ethylenically unsaturated groups) on the polyimide precursor or soluble polyimide of the present invention;
(3) removing the support carrier 21 on the polyimide dry film 20, and performing post-exposure baking;
(4) performing development, to remove the polyimide layer in a non-exposed area; and
(5) optionally, imidizing (curing) the polyimide precursor into polyimide.

The exposure in step (2) may be performed in any manner known to a person of ordinary skill in the art, for example, by using UV light, visible light, electron beam or laser irradiation, and preferably UV light. The exposure energy and time are not particularly limited, and may be adjusted, when needed, by those of ordinary skill in the art. According to an embodiment of the present invention, the exposure energy is about 50 to 1200 mJ/cm$^2$.

The post-exposure baking in step (3) is to increase the difference in solubility of the exposed area and the non-exposed area upon development, by heating. The heating temperature and time are not particularly limited and may be optionally adjusted, as long as they are sufficient for achieving the above objectives. The heating may be conducted in a single stage or in multiple stages. In a specific embodiment of the present invention, the heating is continued for 5 to 90 mins at a temperature ranging from 60 to 150° C. The solvent (for example, the hydrophilic and hydrophobic solvents as described above) contained in the polyimide layer and the liquid absorbed during wet lamination can be partially removed in this heating step.

In step (4), the resin in the non-exposed area is dissolved and removed (when a negative photosensitive polyimide dry film is used) or the resin in the exposed area is dissolved and removed (when a positive photosensitive polyimide dry film is used) by the developing step, and then rinsed with water, to obtain a desired pattern. The developing agent used can be one well known to a person of ordinary skill in the art. Examples of the developing agent include, for example, but are not limited to, an aqueous $K_2CO_3$ solution, an aqueous $Na_2CO_3$ solution, an aqueous KOH solution, an aqueous NaOH solution, and an aqueous tetramethylammonium hydroxide (TMAH) solution.

In addition, when the polyimide layer contains a polyimide precursor, step (5) is performed, for example, by heating, to cyclize and polymerize the polyimide precursor into polyimide, and to further remove the solvent or liquid remaining in the polyimide layer.

The examples below are provided to further illustrate the present invention rather than limit the scope of the present invention. Modifications and changes readily made by any persons of skill in the art are contemplated in the disclosure of the specification and the protection scope of the claims of the present invention.

EXAMPLES

The abbreviations mentioned in the examples below are defined as follows:

DA1:

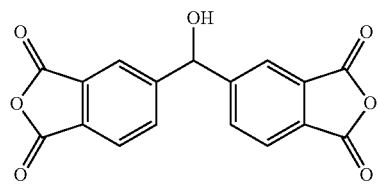

1-M1:

1-methylimidazole

PTZ:

10H-phenothiazine

DA3:

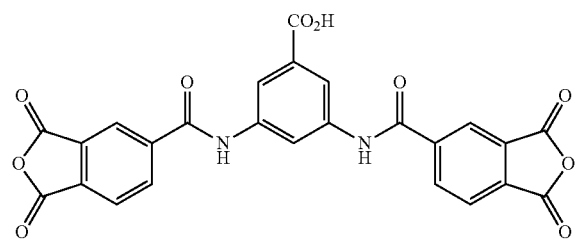

DMC: N,N-dimethylcapramide

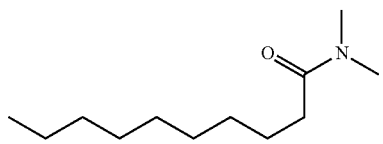

NOP:

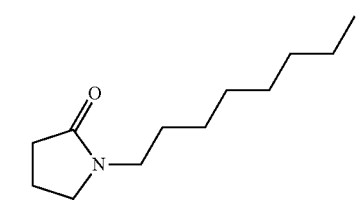

NOEP:

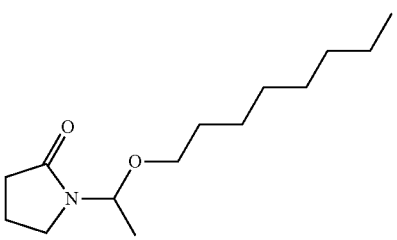

D-PC:

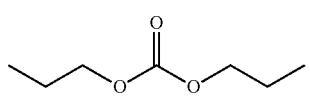

-continued

Decyl acetate:

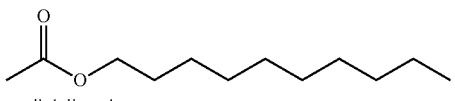

1,6-Hexanediol diacrylate:

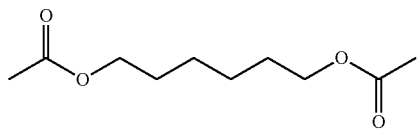

Preparation Example 1: Synthesis of Photosensitive Polyimide Precursor Resin PAA-1

21.81 g (0.1 mol) pyromellitic dianhydride (referred to hereinafter as PMDA) was dissolved in 200 g N-methyl-2-pyrrolidone (referred to hereinafter as NMP). The mixture obtained was then heated to 50° C. and agitated for reaction over 2 hours. 1.161 g (0.01 mol) 2-hydroxyethyl acrylate (referred to hereinafter as HEA) was slowly added dropwise and then the mixture was agitated for reaction over 2 hours at a fixed temperature of 50° C. Then, 20.024 g (0.1 mol) 4,4'-oxydianiline (referred to hereinafter as ODA) was added to the solution, and after complete dissolution, it was farther agitated for reaction over 6 hours at a fixed temperature of 50° C. to form a photosensitive polyimide precursor resin PAA-1, in which the solid content was about 17 wt % (the solid content was obtained by baking the resin at 250° C. or 300° C. for 1 hour to remove all the solvent, and measuring the weight difference of the resin before and after baking to obtain the weight of non-volatile materials and calculate the weight percentage of the non-volatile material in PAA-1).

Preparation Example 2: Synthesis of Photosensitive Polyimide Precursor Resin PAA-2

21.81 g (0.1 mol) PMDA was dissolved in 200 g N-ethyl-2-pyrrolidone (referred to hereinafter as NEP). The mixture obtained was then heated to 50° C. and agitated for reaction over 2 hrs. 1.161 g (0.01 mol) HEA was slowly added dropwise and then the mixture was agitated for reaction over 2 hours at a fixed temperature of 50° C. Then, 20.024 g (0.1 mol) ODA was added to the solution, and after complete dissolution, it was further agitated for reaction over 6 hours at a fixed temperature of 50° C. to form a photosensitive polyimide precursor resin PAA-2, in winch the solid content was about 17 wt % (the solid content was obtained by baking the resin at 250° C. or 300° C. for 1 hour, and measuring the weight difference of the resin before and after baking to obtain the weight of non-volatile materials, and calculate the weight percentage of the non-volatile material in PAA-2).

Preparation Example 3: Synthesis of Photosensitive Polyimide Precursor Resin PAA-3

21.81 g (0.1 mol) PMDA was dissolved in 200 g NMP. The mixture obtained was then heated to 50° C. and agitated for reaction over 2 hrs. 13.01 g (0.01 mol) 2-hydroxyethyl methacrylate (referred to hereinafter as HEMA) was slowly added dropwise and then the mixture was agitated for reaction over 2 hours at a fixed temperature of 50° C. Then, 20.024 g (0.1 mol) ODA was added to the solution, and after complete dissolution, it was further agitated for reaction over 6 hours at a fixed temperature of 50° C. to form a photosensitive polyimide precursor resin PAA-3, in which the solid content was about 21 wt %.

Preparation Example 4: Synthesis of Photosensitive Polyimide Precursor Resin PAA-4

29.42 g (0.1 mol) 4,4'-Biphthalic dianhydride (referred to hereinafter as BPDA) was dissolved in 200 g NMP. The mixture obtained was then heated to 50° C. and agitated for reaction over 2 hrs. 13.01 g (0.01 mol) HEMA was slowly added dropwise and then the mixture was agitated for reaction over 24 hours at a fixed temperature of 50° C. Then, 32.024 g (0.1 mol) 2,2'-bis(trifluoromethyl) benzidine (referred to hereinafter as TFMB) was added to the solution, and after complete dissolution, it was further agitated for reaction over 6 hours at a fixed temperature of 50° C. to form a photosensitive polyimide precursor resin PAA-4, in which the solid content was about 20 wt %.

Preparation Example 5: Synthesis of Polyimide Precursor Resin PAA-5

21.81 g (0.1 mol) PMDA was dissolved in 200 g NMP. The mixture obtained was then heated to 50° C. and agitated for reaction over 2 hrs. 0.601 g (0.01 mol) isopropanol was slowly added dropwise, and then the mixture was agitated for reaction over 2 hours at a fixed temperature of 50° C. Then, 32.02 g (0.1 mol) TFMB was added to the solution, and after complete dissolution, it was further agitated for reaction over 6 hours at a fixed temperature of 50° C. to form a polyimide precursor resin PAA-5, in which the solid content was about 21 wt %.

Preparation Example 6: Synthesis of Polyimide Precursor Resin PAA-6

29.42 g (0.1 mol) BPDA was dissolved in 200 g NMP. The mixture obtained was then heated to 50° C. and agitated for reaction over 2 hrs. 0.601 g (0.01 mol) isopropanol was slowly added dropwise, and then the mixture was agitated for reaction over 2 hours at a fixed temperature of 50° C. Then, 20.024 g (0.1 mol) ODA was added to the solution, and after complete dissolution, it was further agitated for reaction over 6 hours at a fixed temperature of 50° C. to form a polyimide precursor resin PAA-6, in which the solid content was about 19 wt %.

Preparation Example 7: Synthesis of Carboxyl Group (—COOH)— Containing Polyimide SPI-1

43.62 g (0.2 mol) PMDA and 30.43 g (0.2 mol) 3,5-diamino benzoic acid (referred to hereinafter as DABA) were weighed and 300 mL NMP was added. The mixture obtained was agitated for 1 hour at room temperature. Then, the mixture was heated to 50° C. and agitated for 4 hours. After 4 hours, 50 mL toluene was added. Water was removed by a dean-stark device at 150° C. Toluene was removed after the completion of water removal and a carboxyl group-containing polyimide solution SPI-1 was obtained, in which the solid content was about 19 wt %.

Preparation Example 8: Synthesis of Isocyanate-modified Soluble 64.85 g (0.2 mol) DAI and 42.46 g (0.2 mol) 2,2'-dimethylbiphenyl-4,4'-diamine (referred to hereinafter as DMDB) were weighed and 300 mL NMP was added. The mixture was agitated for 1 hour at room temperature. Then, the mixture was heated to 50° C. and agitated for 4 hours. After 4 hours, 50 mL toluene was added. Water was removed by a dean-stark device at 130° C. After the completion of water removal and toluene removal, the solution was cooled to room temperature. 7 g (0.05 mol) 2-isocyanatoethyl acrylate (referred to hereinafter as 2-IEA), 0.05 g 1-MI and 0.06 g PTZ were added. The solution was heated to 80° C. and agitated for 8 hours to obtain an isocyanate-modified soluble polyimide SPI-2, in which the solid content was about 27 wt %.

Preparation Example 9: Synthesis of Carboxyl Group (—COOH)— Containing Soluble Polyimide SPI-3

100.074 g (0.2 mol) DA3 and 42.46 g (0.2 mol) DMDB were weighed, and 450 ml NMP was added. The mixture obtained was agitated for 1 hour at room temperature. Then, the mixture was heated to 50° C. and agitated for 4 hours. Then, 50 mL toluene was added. Water was removed by a dean-stark device at 130° C. After the completion of water removal and toluene removal, a —COOH containing soluble polyimide SPI-3 was obtained, in which the solid content was about 24 wt %.

Preparation Example 10: Synthesis of Epoxy-modified Soluble Photosensitive Polyimide SPI-4

142.5 g polyimide SPI-3 obtained in Preparation Example 9 was weighed, and then 6.11 g (0.05 mol) glycidyl methacrylate (referred to hereinafter as GMA), 0.015 g tetrabutylammonium bromide (referred to hereinafter as TBAB) and 0.06 g hydroquinone monomethyl ether, (referred to hereinafter as MEHQ) were added. The solution was heated to 90° C., and agitated for 12 hours, to obtain an epoxy-modified soluble photosensitive polyimide SPI-4, in which the solid content was about 25 wt %.

Preparation Example 11: Synthesis of Acrylic Photosensitive Group-containing Polyimide Solution SPI-5

32.023 g (0.1 mol) TFMB and 48.8664 g (0.11 mol) 4,4'-(hexafluoroisopropylidene)diphthalic anhydride (referred to hereinafter as 6 FDA) were weighed, and 300 mL NMP was added. The mixture was agitated for 1 hour at room temperature and then heated to 50° C. and agitated for 4 hours. After 4 hours, 50 mL toluene was added. Water was removed by a dean-stark device at 150° C. After the completion of water removal and toluene removal, 2.322 g (0.02 mol) HEA was added at 50° C., and the mixture was agitated for 4 hours to obtain an acrylic photosensitive group-containing polyimide solution SPI-5, in which the solid content was about 21 wt %.

Preparation Example 12: Synthesis of Polyimide Precursor Resin PAA-7

21.81 g (0.1 mol) PMDA was dissolved in 200 g N,N-dimethylacetamide (referred to hereinafter as DMAc). The mixture obtained was then heated to 50° C. and agitated for reaction over 2 hours. 0.601 g (0.01 mol) isopropanol was slowly added dropwise, and then the mixture was agitated for reaction over 2 hours at a fixed temperature of 50° C. Then, 32.02 g (0.1 mol) TFMB was added to the solution, and after complete dissolution, it was further agitated for reaction over 6 hours at a fixed temperature of 50° C. to form a polyimide precursor resin PAA-7, in which the solid content was about 20 wt %.

Preparation Example 13: Synthesis of Polyimide Precursor Resin PAA-8

21.81 g (0.1 mol) PMDA was dissolved in 200 g γ-butyrolactone. The mixture obtained was then heated to 50° C. and agitated for reaction over 2 hours. 0.601 g (0.01 mol) isopropanol was slowly added dropwise, and then the mixture was agitated for reaction over 3 hours at a fixed temperature of 50° C. Then, 32.02 g (0.1 mol) TFMB was added to the solution, and after complete dissolution, it was further agitated for reaction over 6 hours at a fixed temperature of 50° C. to form a polyimide precursor resin PAA-8, in which the solid content was about 21 wt %.

Preparation Example 14: Synthesis of Carboxyl Group (—COOH)— Containing Soluble Polyimide SPI-6

43.62 g (0.2 mol) PMDA and 30.43 g (0.2 mol) DABA were weighed, and 300 mL DMAc was added. The mixture was agitated for 1 hour at room temperature and then heated to 50° C. and agitated for 4 hours. After 4 hours, 50 mL toluene was added. Water was removed by a dean-stark device at 150° C. After the completion of water removal, toluene was removed to obtain a carboxyl group containing polyimide solution SPI-6, in which the solid content was about 20 wt %.

Preparation of a Dry Film

To 100 parts by weight of the polyimide precursor solution or soluble polyimide solution prepared in Preparation Examples 1 to 14, a hydrophobic solvent and an optional stabilizer were added according to the proportion (parts by weight) shown in Tables 1 to 5, and 2 parts by weight of a thermal base generator

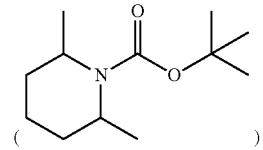

was also added. In addition, in the case of a photosensitive polyimide precursor solution or a photosensitive soluble polyimide solution (for example, PAA-1 to PAA-4, SPI-2, SPI-4, and SPI-5), 1 part by weight of a photoinitiator (2,4,6-trimethylbenzoyl diphenylphosphine oxide and benzoin at a ratio of 1:1) was further added, to prepare a coating composition.

Each coating composition was evenly applied on a polyethylene terephthalate (Model #: R310, available from Mitsubishi Chemical) carrier evenly by using a blade coater, and baked in an oven. Baking temperature and time were respectively shown in each table. Then, a release film (Model #: L150L, available from Nan Ya Plastics Corporation) was used to cover the surface coated with the coating composition. A dry film having a coating of the polyimide precursor or a coating of the soluble polyimide was obtained. The thickness of the coating was about 40 μm.

Prior to coating, the amount of the hydrophilic solvent and the amount of the hydrophobic solvent added (parts by weight) were based on 100 parts by weight of the polyimide precursor solution or the soluble polyimide solution. While after drying, the amount of the hydrophilic solvent and the amount of the hydrophobic solvent (wt %) were based on the total weight of the resin layer.

Test of the Dry Film

The solvent content and physical properties of the dry film, including stickiness, transferability, water absorbability, bendability, and photosensitivity, were tested, of the details of the tests are described below:

1. Test of Solvent Content 0.01 g polyimide precursor coating or soluble polyimide coating (the PET carrier and the release film were not included) was taken and dissolved in dimethyl sulfoxide (DMSO). A 7890GC gas chromatograph manufactured by Agilent Technologies Co., Ltd., with the column model: DB1701 (0.53 mm, 30 mm, 1.5 um) was used to perform quantitative gas chromatography.

2. Test of Stickiness of the Dry Film

The release film was peeled off from the dry film obtained in each example and comparative example to observe whether there is resin from the polyimide layer remained on the release film. No residue was denoted as 0, <10% residue was denoted as 1, 10%-20% residue was denoted as 2, and >20% residue was denoted as NG.

3. Test of Transferability

A 20*20 cm dry film was taken, and the release film was peeled off. Then, the dry film was laminated by dry lamination or wet lamination onto a copper clad laminate having a circuit formed thereon, the polyimide layer of the dry film facing toward the copper clad laminate (L/S=30/30 μm; L/S is line width/line spacing):

(a) Wet Lamination

Deionized water was applied onto the surface (which has a circuit formed thereon) of the copper clad laminate, and then lamination was conducted by using hot rollers at a temperature of 60° C. with 5 kgf/cm$^2$ pressure.

(b) Dry Lamination

The lamination was conducted on the surface (which has a circuit formed thereon) of the copper clad laminate by using hot rollers at a temperature of 60° C. with 5 kgf/cm$^2$ pressure.

After standing for 10 mins, the PET film was peeled off from the dry film, to observe whether there is resin from the polyimide layer remained on the PET film. No residue on the PET film was denoted as 0, <10% residue was denoted as 1, 10%-20% residue was denoted as 2, and >20% residue on the PET film was denoted as NG.

4. Test of Water Absorbability

A 20*20 cm dry film was laminated by the wet lamination described above onto the surface (which has a circuit formed thereon) of a copper clad laminate, the polyimide layer of the dry film facing toward the surface of the copper clad laminate. The laminated product was stood and observed under a microscope to find out the time over which water on the copper clad laminate is fully absorbed. The observation was conducted every 5 mins in the first hour and every 30 mins after the first hour.

5. Bubbling Test

A 20*20 cm dry film was laminated by the wet lamination or dry lamination described above onto the surface (which has a circuit formed thereon) of a copper clad laminate, die polyimide layer of the dry film facing toward the surface of the copper clad laminate. The laminated product was stood for 10 mins to observed for remaining bubbles. No bubbles exist, "Pass" is recorded; bubbles exist, "NG" is recorded.

6. Physical Property Test (Bendability Test 1)

A 20*20 cm dry film was laminated by the wet lamination or dry lamination described above onto the surface (which has a circuit formed thereon) of a copper clad laminate, the polyimide layer of the dry film facing toward the surface of the copper clad laminate. The laminated product was stood for 120 mins, baked at 250° C. for 120 mins, then cooled to room temperature, and tested for bendability with a Measure Infect Turn (MIT) test machine (K. D. H. Incorporation), at a bend angle of 135 degrees and a bend radius R=0.38 mm under a load of 500 g. The number of bends experienced by the circuit board until the circuit failed was recorded. A larger number of bends indicates a better physical property of the formed polyimide layer.

7. Physical Property Test (Bendability Test 2 for Photosensitive Material)

A 20*20 cm dry film was laminated by the wet lamination or dry lamination described above onto die surface (which has a circuit formed thereon) of a copper clad laminate, the polyimide layer of the dry film facing toward die surface of the copper clad laminate. The laminated product was stood for 120 mins, and exposed by using a UV exposure machine (at an exposure energy of 400 ml/cm$^2$). Then, the PET film was peeled off. The dry film was baked at 90° C. for 10 mins, developed with a 1 wt % aqueous $K_2CO_3$ solution, baked at 250° C. for 120 mins, then cooled to room temperature, and tested for bendability with a MIT test machine (K. D. H. Incorporation), at a bend angle of 135 degrees and a bend radius R=0.38 mm under a load of 500 g. The number of bends experienced by the circuit board until the circuit failed was recorded. A larger number of bends indicates a better physical property of the formed polyimide layer.

8. Physical Property Test (Bendability Test 3):

20*20 cm dry films (4 pieces from each example) were stood at room temperature, and then laminated by the wet lamination described above onto the surface (which has a circuit formed thereon) of a copper clad laminate at day 1, 3, 5, and 7, respectively, the polyimide layer of the dry film facing toward the surface of the copper clad laminate. The laminated products were stood for 120 mins, baked at 250° C. for 120 mins, then cooled to room temperature, and tested for the bendability with a MIT test machine (K. D. H. Incorporation), at a bend angle of 135 degrees and a bend radius R=0.38 mm under a load of 500 g. For the products having a number of bends of less than 200, the number of days of standing was recorded. Longer days of standing indicate a better storage stability of the dry film.

9. Physical Property Test (Bendability Test 4):

A 20*20 cm dry film was laminated by the wet lamination described above onto the surface (which has a circuit formed thereon) of a copper clad laminate, the polyimide layer of the dry film facing toward the surface of the copper clad laminate. The laminated product was stood at room temperature. A 2*10 cm sample was taken off from the laminated product every 6 hours, baked at 250° C. for 120 mins, then cooled to room temperature, and tested for the bendability with a MIT test machine (K. D. H. Incorporation), at a bend angle of 135 degrees and a bend radius R=0.38 mm under a load of 500 g. For the sample having a number of bends of less than 200, the number of hours of standing was recorded. Longer hours of standing indicate a better process stability of the dry film.

10. Photosensitivity Test

A 20*20 cm dry film was laminated by the wet lamination or dry lamination described above onto the surface (which has a circuit formed thereon) of a copper clad laminate, the polyimide layer of the dry film facing toward the surface of the copper clad laminate. The laminated product was stood for 120 mins, and the polyimide layer was exposed with UV light (at an energy of 50 ml/cm$^2$, 100 ml/cm$^2$, 150 J/cm$^2$, 200 J/cm$^2$, 250 J/cm) by using a glass mask having an L/S of 60/60 μm and a via size of 60 μm.

After exposure, the PET film was peeled off, and the dry film was dried for 10 mins in an oven at 90° C., and developed in a 1 wt % aqueous $K_2CO_3$ solution. Then, the resolution of L/S (μm) and via (μm) on the polyimide layer after development was measured by SEM, and the exposure energy that results in a satisfactory resolution was recorded. A lower exposure energy indicates a desirable photosensitivity of the material.

The test results of each example and comparative example are shown in Tables 1 to 7.

TABLE 1

<Comparison of the effect of different hydrophobic solvents>

| | PI precursor or soluble PI | Hydrophilic solvent | Hydrophobic solvent | Content of hydrophilic solvent before application (parts by weight) | Content of hydrophobic solvent before application (parts by weight) | Baking condition (°C./min) | Content of hydrophilic solvent in dry film (wt %) | Content of hydrophobic solvent in dry film (wt %) | Hydrophilic solvent/ hydrophobic solvent | Stickiness of dry film | Transferability test (wet lamination) | Water absorbability |
|---|---|---|---|---|---|---|---|---|---|---|---|---|
| Comparative Example 1-1 | PAA-1 | NMP | — | 83 | 0 | 95° C./5 min | 19.2 | 0 | — | NG | NA | NA |
| Example 1-2 | PAA-1 | NMP | NOP | 83 | 24 | 95° C./5 min | 18.9 | 33.5 | 0.56 | 0 | 0 | 10 min |
| Example 1-3 | PAA-1 | NMP | 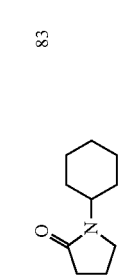 | 83 | 24 | 95° C./5 min | 18.5 | 40.2 | 0.46 | 0 | 0 | 10 min |
| Comparative Example 1-4 | PAA-5 | NMP | — | 79 | 0 | 95° C./5 min | 15.3 | 0 | — | NG | NA | NA |
| Example 1-5 | PAA-5 | NMP | 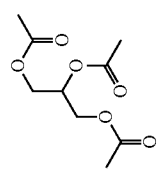 | 79 | 30 | 95° C./5 min | 15.3 | 31.9 | 0.48 | 0 | 0 | 10 min |
| Example 1-6 | PAA-5 | NMP | Decyl acetate | 79 | 20 | 95° C./5 min | 14.8 | 40.1 | 0.37 | 0 | 0 | 20 min |
| Example 1-7 | PAA-5 | NMP | D-PC | 79 | 20 | 95° C./5 min | 15.1 | 27.5 | 0.55 | 0 | 0 | 10 min |
| Example 1-8 | PAA-5 | NMP | NOP | 79 | 20 | 95° C./5 min | 14.6 | 37.3 | 0.39 | 0 | 0 | 20 min |
| Example 1-9 | PAA-5 | NMP | NOEP | 79 | 20 | 95° C./5 min | 15.5 | 33.3 | 0.47 | 0 | 0 | 20 min |
| Example 1-10 | PAA-5 | NMP | 1,6-Hexanediol diacrylate | 79 | 20 | 95° C./5 min | 14.6 | 22.7 | 0.64 | 0 | 0 | 15 min |

TABLE 1-continued

<Comparison of the effect of different hydrophobic solvents>

| | PI precursor or soluble PI | Hydrophilic solvent | Hydrophobic solvent | Content of hydrophilic solvent before application (parts by weight) | Content of hydrophobic solvent before application (parts by weight) | Baking condition (° C./min) | Content of hydrophilic solvent in dry film (wt %) | Content of hydrophobic solvent in dry film (wt %) | Hydrophilic solvent/ hydrophobic solvent | Stickiness of dry film | Transferability test (wet lamination) | Water absorbability |
|---|---|---|---|---|---|---|---|---|---|---|---|---|
| Example 1-11 | PAA-5 | NMP | DMC | 79 | 20 | 95° C./5 min | 15.3 | 30.2 | 0.51 | 0 | 0 | 20 min |
| Comparative Example 1-12 | SPI-1 | NMP | — | 81 | 0 | 95° C./5 min | 16.4 | 0 | — | NG | NA | NA |
| Example 1-13 | SPI-1 | NMP | NOEP | 81 | 30 | 95° C./5 min | 16.4 | 45.9 | 0.36 | 0 | 0 | 20 min |
| Example 1-14 | SPI-1 | NMP | D-PC | 81 | 30 | 95° C./5 min | 15.9 | 21.4 | 0.74 | 0 | 0 | 20 min |
| Comparative Example 1-15 | SPI-4 | NMP | — | 75 | 0 | 95° C./5 min | 12.1 | 0 | — | NG | NA | NA |
| Example 1-16 | SPI-4 | NMP | NOEP | 75 | 30 | 95° C./5 min | 12.1 | 46.3 | 0.26 | 0 | 0 | 30 min |
| Example 1-17 | SPI-4 | NMP | DMC | 75 | 30 | 95° C./5 min | 12.7 | 40.5 | 0.31 | 0 | 0 | 30 min |

NA: not available

TABLE 2

<Comparison of the effect of different resins/different hydrophilic solvents>

| | PI precursor or soluble PI | Hydrophilic solvent | Hydrophobic solvent | Content of hydrophilic solvent before application (parts by weight) | Content of hydrophobic solvent before application (parts by weight) | Baking condition (° C./min) | Content of hydrophilic solvent in dry film (wt %) | Content of hydrophobic solvent in dry film (wt %) | Hydrophilic solvent/ hydrophobic solvent | Stickiness of dry film | Transferability (wet lamination) | Water absorbability |
|---|---|---|---|---|---|---|---|---|---|---|---|---|
| Example 2-1 | PAA-1 | NMP | DMC | 83 | 13 | 90° C./5 min | 17.9 | 36.6 | 0.49 | 0 | 0 | 20 min |
| Example 2-2 | PAA-2 | NEP | DMC | 83 | 13 | 100° C./5 min | 17.7 | 35.7 | 0.50 | 0 | 0 | 30 min |
| Example 2-3 | PAA-3 | NMP | DMC | 79 | 13 | 90° C./5 min | 16.6 | 33.4 | 0.50 | 0 | 0 | 20 min |
| Example 2-4 | PAA-4 | NMP | DMC | 80 | 13 | 90° C./5 min | 17.1 | 35.2 | 0.49 | 0 | 0 | 30 min |
| Example 2-5 | PAA-5 | NMP | DMC | 79 | 13 | 90° C./5 min | 16.3 | 33.5 | 0.49 | 0 | 0 | 20 min |
| Example 2-6 | PAA-6 | NMP | DMC | 81 | 13 | 90° C./5 min | 15.7 | 34.6 | 0.45 | 0 | 0 | 20 min |
| Example 2-7 | PAA-7 | DMAc | DMC | 80 | 13 | 80° C./5 min | 16.9 | 34.7 | 0.49 | 0 | 0 | 10 min |
| Example 2-8 | PAA-8 | γ-butyrolactone | DMC | 81 | 13 | 80° C./10 min | 16.6 | 34.8 | 0.48 | 0 | 0 | 40 min |
| Example 2-9 | SPI-1 | NMP | DMC | 81 | 13 | 90° C./5 min | 16.1 | 37.1 | 0.43 | 0 | 0 | 20 min |
| Example 2-10 | SPI-6 | DMAc | DMC | 80 | 13 | 80° C./5 min | 15.4 | 33.1 | 0.47 | 0 | 0 | 10 min |
| Example 2-11 | SPI-2 | NMP | DMC | 73 | 13 | 90° C./3 min | 16.7 | 37.2 | 0.45 | 0 | 0 | 20 min |
| Example 2-12 | SPI-3 | NMP | DMC | 76 | 13 | 90° C./3 min | 17.2 | 35.8 | 0.48 | 0 | 0 | 20 min |

TABLE 3

<Comparison of the effect of different ratio of hydrophilic solvent/hydrophobic solvent>

| | PI precursor or soluble PI | Hydrophilic solvent | Hydrophobic solvent | Content of hydrophilic solvent before application (parts by weight) | Content of hydrophobic solvent before application (parts by weight) | Baking condition (° C./min) | Content of hydrophilic solvent in dry film (wt %) | Content of hydrophobic solvent in dry film (wt %) |
|---|---|---|---|---|---|---|---|---|
| Example 3-1 | PAA-1 | NMP | NOP | 83 | 60 | 120° C./10 min | 3.6 | 57.1 |
| Example 3-2 | PAA-1 | NMP | NOP | 83 | 35 | 120° C./10 min | 6.37 | 49 |
| Example 3-3 | PAA-1 | NMP | NOP | 83 | 20 | 110° C./10 min | 11.3 | 36.6 |
| Example 3-4 | PAA-1 | NMP | NOP | 83 | 13 | 90° C./5 min | 18.4 | 34.8 |
| Example 3-5 | PAA-1 | NMP | NOP | 83 | 8 | 90° C./5 min | 17.7 | 24.6 |
| Example 3-6 | PAA-1 | NMP | NOP | 83 | 5 | 80° C./5 min | 26.8 | 28.51 |
| Example 3-7 | PAA-1 | NMP | NOP | 83 | 5 | 60° C./5 min | 39.2 | 26.1 |
| Example 3-8 | PAA-1 | NMP | NOP | 83 | 3.5 | 60° C./5 min | 38.7 | 20.3 |
| Comparative Example 3-9 | PAA-1 | NMP | NOP | 83 | 60 | 120° C./15 min | 2.4 | 61.3 |
| Comparative Example 3-10 | PAA-1 | NMP | NOP | 83 | 2.5 | 60° C./5 min | 38.4 | 17.5 |

| | Hydrophilic solvent/ hydrophobic solvent | Stickiness of dry film | Transferability (wet lamination) | Water absorbability | Bendability test 1 (wet lamination) (times) | Bendability test 3 (wet lamination) (days) |
|---|---|---|---|---|---|---|
| Example 3-1 | 0.06 | 0 | 1 | 240 min | 284 | 5 |
| Example 3-2 | 0.13 | 0 | 1 | 120 min | 397 | 5 |

TABLE 3-continued

| <Comparison of the effect of different ratio of hydrophilic solvent/hydrophobic solvent> | | | | | | |
|---|---|---|---|---|---|---|
| Example 3-3 | 0.31 | 0 | 0 | 30 min | 472 | 5 |
| Example 3-4 | 0.53 | 0 | 0 | 20 min | 483 | 5 |
| Example 3-5 | 0.72 | 0 | 0 | 10 min | 460 | 5 |
| Example 3-6 | 0.94 | 0 | 0 | 10 min | 408 | 5 |
| Example 3-7 | 1.5 | 1 | 0 | 5 min | 413 | 3 |
| Example 3-8 | 1.9 | 2 | 0 | 5 min | 417 | 3 |
| Comparative Example 3-9 | 0.04 | 0 | NG | 240 min | 83 | 5 |
| Comparative Example 3-10 | 2.2 | NG | NA | NA | NA | NA |

TABLE 4

<Comparison of the effect of stabilizers added>

| | PI precursor or soluble PI | Hydrophilic solvent | Hydrophobic solvent | Stabilizer and amount therefore before application (parts by weight) | Content of hydrophilic solvent before application (parts by weight) | Content of hydrophobic solvent before application (parts by weight) | Baking condition (° C./min) | Content of hydrophilic solvent in dry film (wt %) | Content of hydrophobic solvent in dry film (wt %) | Hydrophilic solvent/hydrophobic solvent | Stabilizer content in dry film (wt %) | Stickiness of dry film | Transferability test (wet lamination) | Water absorbability | Bendability test 1 (wet lamination) (times) | Bendability test 4 (wet lamination) (hrs) |
|---|---|---|---|---|---|---|---|---|---|---|---|---|---|---|---|---|
| Example 4-1 | PAA-1 | NMP | D-PC | — | 83 | 13 | 90° C./5 min | 17.4 | 34.8 | 0.5 | 0 | 0 | 0 | 20 min | 341 | 24 |
| Example 4-2 | PAA-1 | NMP | D-PC | H$_3$CO–C(OCH$_3$)–N(CH$_3$)$_2$  1.5 | 83 | 13 | 90° C./5 min | 17.2 | 35.3 | 0.49 | 0.5 | 0 | 0 | 10 min | 384 | 30 |
| Example 4-3 | PAA-1 | NMP | D-PC | H$_3$CO–C(OCH$_3$)–N(CH$_3$)$_2$  3 | 83 | 13 | 90° C./5 min | 16.8 | 34.2 | 0.49 | 1 | 0 | 0 | 5 min | 402 | 42 |
| Example 4-4 | PAA-1 | NMP | D-PC | H$_3$CO–C(OCH$_3$)–N(CH$_3$)$_2$  6 | 83 | 13 | 90° C./5 min | 17.1 | 35.0 | 0.49 | 2 | 0 | 0 | 5 min | 411 | 48 |
| Example 4-5 | PAA-1 | NMP | D-PC | H$_3$CO–C(OCH$_3$)–N(CH$_3$)$_2$  9 | 83 | 13 | 90° C./5 min | 16.4 | 33.2 | 0.49 | 3 | 0 | 0 | 5 min | 393 | 48 |
| Example 4-6 | PAA-1 | NMP | D-PC | H$_3$CO–C(OCH$_3$)–N(CH$_3$)$_2$  15 | 83 | 13 | 90° C./5 min | 17.8 | 35.7 | 0.50 | 5 | 0 | 0 | 5 min | 366 | 48 |

TABLE 4-continued

<Comparison of the effect of stabilizers added>

| | PI precursor or soluble PI | Hydrophilic solvent | Hydrophobic solvent | Stabilizer and amount therefore before application (parts by weight) | Content of hydrophilic solvent before application (parts by weight) | Content of hydrophobic solvent before application (parts by weight) | Baking condition (° C./min) | Content of hydrophilic solvent in dry film (wt %) | Content of hydrophobic solvent in dry film (wt %) | Hydrophilic solvent/ hydrophobic solvent | Stabilizer content in dry film (wt %) | Stickiness of dry film | Transferability test (wet lamination) | Water absorbability | Bendability test 1 (wet lamination) (times) | Bendability test 4 (wet lamination) (hrs) |
|---|---|---|---|---|---|---|---|---|---|---|---|---|---|---|---|---|
| Comparative Example 4-7 | PAA-1 | NMP | D-PC |  15 | 83 | 13 | 90° C./ 5 min | 17.2 | 36.1 | 0.48 | 6 | 0 | 0 | 5 min | 301 | 48 |
| Example 4-8 | PAA-1 | NMP | DMC | — | 83 | 15 | 80° C./ 5 min | 20.3 | 43.2 | 0.47 | 0 | 0 | 0 | 10 min | 407 | 24 |
| Example 4-9 | PAA-1 | NMP | DMC |  1 | 83 | 15 | 80° C./ 5 min | 20.3 | 43.2 | 0.47 | 0.3 | 0 | 0 | 10 min | 440 | 30 |
| Example 4-10 | PAA-1 | NMP | DMC |  2 | 83 | 15 | 80° C./ 5 min | 20.1 | 42.7 | 0.47 | 0.6 | 0 | 0 | 5 min | 523 | 36 |
| Example 4-11 | PAA-1 | NMP |  | — | 83 | 25 | 95° C./ 5 min | 13.5 | 46.4 | 0.29 | 0 | 0 | 0 | 20 min | 352 | 18 |
| Example 4-12 | PAA-1 | NMP |  |  0.5 | 83 | 25 | 95° C./ 5 min | 13.5 | 46.4 | 0.29 | 0.3 | 0 | 0 | 10 min | 363 | 24 |

TABLE 4-continued

<Comparison of the effect of stabilizers added>

| | PI precursor or soluble PI | Hydrophilic solvent | Hydrophobic solvent | Stabilizer and amount therefore before application (parts by weight) | Content of hydrophilic solvent before application (parts by weight) | Content of hydrophobic solvent before application (parts by weight) | Baking condition (° C./min) | Content of hydrophilic solvent in dry film (wt %) | Content of hydrophobic solvent in dry film (wt %) | Hydrophilic solvent/hydrophobic solvent | Stabilizer content in dry film (wt %) | Stickiness of dry film | Transferability test (wet lamination) | Water absorbability | Bendability test 1 (wet lamination) (times) | Bendability test 4 (wet lamination) (hrs) |
|---|---|---|---|---|---|---|---|---|---|---|---|---|---|---|---|---|
| Example 4-13 | PAA-1 | NMP | triacetin | N,N-dimethyl 1,3-dioxan-2-amine, 1.5 | 83 | 25 | 95° C./5 min | 13.9 | 47.5 | 0.29 | 0.9 | 0 | 0 | 5 min | 459 | 36 |
| Example 4-14 | PAA-1 | NMP | NOEP | — | 83 | 50 | 120° C./15 min | 3.8 | 62.5 | 0.06 | 0 | 0 | 1 | 240 min | 241 | 24 |
| Example 4-15 | PAA-1 | NMP | NOEP | tetrahydro-oxazolo-oxazole, 1 | 83 | 50 | 120° C./15 min | 3.7 | 63.1 | 0.06 | 0.4 | 0 | 1 | 180 min | 262 | 36 |
| Example 4-16 | PAA-1 | NMP | NOEP | tetrahydro-oxazolo-oxazole, 3 | 83 | 50 | 120° C./15 min | 3.7 | 62.1 | 0.06 | 1.2 | 0 | 1 | 150 min | 316 | 48 |

TABLE 5

<Comparison of the effect of different total amounts of solvents>

| | PI precursor or soluble PI | Hydrophilic solvent and content thereof (parts by weight) | Hydrophobic solvent | Stabilizer and amount before application (parts by weight) | Content of hydrophilic solvent before application (parts by weight) | Amount of hydrophobic solvent before application (parts by weight) | Baking condition (° C./min) | Content of hydrophilic solvent in dry film (wt %) | Content of hydrophobic solvent in dry film (wt %) | Hydrophilic solvent/ hydrophobic solvent | Stabilizer content in dry film (wt %) | Total content of solvent in dry film (wt %) | Stickiness of dry film | Transferability test (wet lamination) | Water absorbability | Bendability test 1 |
|---|---|---|---|---|---|---|---|---|---|---|---|---|---|---|---|---|
| Comparative Example 5-1 | PAA-1 | NMP | NOEP |  3 | 83 | 5 | 100° C./ 5 min | 7.2 | 18.1 | 0.40 | 1.0 | 25.3 | 0 | NG | 150 min | 78 |
| Example 5-2 | PAA-1 | NMP | NOEP |  3 | 83 | 8 | 100° C./ 3 min | 9.6 | 23.6 | 0.41 | 1.0 | 33.2 | 0 | 1 | 120 min | 451 |
| Example 5-3 | PAA-1 | NMP | NOEP |  3 | 83 | 10 | 95° C./ 3 min | 11.2 | 28.4 | 0.39 | 1.2 | 39.6 | 0 | 0 | 30 min | 467 |
| Example 5-4 | PAA-1 | NMP | NOEP |  3 | 83 | 20 | 90° C./ 5 min | 13.2 | 32.9 | 0.40 | 1.2 | 46.1 | 0 | 0 | 20 min | 472 |
| Example 5-5 | PAA-1 | NMP | NOEP |  3 | 83 | 25 | 90° C./ 3 min | 16.5 | 38.5 | 0.43 | 1.2 | 55 | 0 | 0 | 15 min | 459 |

TABLE 5-continued

<Comparison of the effect of different total amounts of solvents>

| | PI precursor or soluble PI | Hydrophilic solvent and content thereof (parts by weight) | Hydrophobic solvent | Stabilizer and amount before application (parts by weight) | Content of hydrophilic solvent before application (parts by weight) | Amount of hydrophobic solvent before application (parts by weight) | Baking condition (°C./min) | Content of hydrophilic solvent in dry film (wt %) | Content of hydrophobic solvent in dry film (wt %) | Hydrophilic solvent/ hydrophobic solvent | Stabilizer content in dry film (wt %) | Total content of solvent in dry film (wt %) | Stickiness of dry film | Transferability test (wet lamination) | Water absorbability | Bendability test 1 |
|---|---|---|---|---|---|---|---|---|---|---|---|---|---|---|---|---|
| Example 5-6 | PAA-1 | NMP | NOEP |  3 | 83 | 25 | 90° C./ 2 min | 17.1 | 42.6 | 0.40 | 1.2 | 59.7 | 0 | 0 | 10 min | 466 |
| Example 5-7 | PAA-1 | NMP | NOEP |  3 | 83 | 28 | 90° C./ 2 min | 19.3 | 48.6 | 0.40 | 1.2 | 67.9 | 1 | 0 | 10 min | 480 |
| Comparative Example 5-8 | PAA-1 | NMP | NOEP |  3 | 83 | 30 | 95° C./ 5 min | 21.9 | 51.9 | 0.42 | 1.2 | 73.8 | NG | NA | NA | NA |

TABLE 6

<Comparison of the effect of different lamination methods>

| | PI precursor or soluble PI | Hydrophilic solvent | Hydrophobic solvent | Content of hydrophilic solvent in dry film (wt %) | Content of hydrophobic solvent in dry film (wt %) | Hydrophilic solvent/ hydrophobic solvent | Dry film dewatering agent and content thereof | Lamination method | Transferability test | Remaining bubbles | Bendability test 1 | Bendability test 2 |
|---|---|---|---|---|---|---|---|---|---|---|---|---|
| Example 2-5 | PAA-5 | NMP | DMC | 16.3 | 33.5 | 0.49 | 0 | Dry | 0 | NG | 120 | NA |
| Example 2-5 | PAA-5 | NMP | DMC | 16.3 | 33.5 | 0.49 | 0 | Wet | 0 | PASS | 359 | NA |
| Example 3-1 | PAA-1 | NMP | NOP | 3.6 | 57.1 | 0.06 | 0 | Dry | NG | NG | NA | NA |
| Example 3-1 | PAA-1 | NMP | NOP | 3.6 | 57.1 | 0.06 | 0 | Wet | 1 | PASS | 284 | 301 |
| Example 3-6 | PAA-1 | NMP | NOP | 26.8 | 28.5 | 0.94 | 0 | Dry | 0 | NG | 113 | 125 |
| Example 3-6 | PAA-1 | NMP | NOP | 26.8 | 28.5 | 0.94 | 0 | Wet | 0 | PASS | 408 | 395 |
| Example 2-9 | SPI-1 | NMP | DMC | 16.1 | 37.1 | 0.43 | 0 | Dry | 0 | NG | 187 | NA |
| Example 2-9 | SPI-1 | NMP | DMC | 16.1 | 37.1 | 0.43 | 0 | Wet | 0 | PASS | 459 | NA |
| Example 1-16 | SPI-4 | NMP | NOEP | 12.1 | 46.3 | 0.26 | 0 | Dry | 0 | NG | 107 | 111 |
| Example 1-16 | SPI-4 | NMP | NOEP | 12.1 | 46.3 | 0.26 | 0 | Wet | 0 | PASS | 344 | 327 |
| Example 5-5 | PAA1 | NMP | NOEP | 16.5 | 38.5 | 0.43 | 1.2 | Dry | 0 | NG | 159 | 172 |
| Example 5-5 | PAA1 | NMP | NOEP | 16.5 | 38.5 | 0.43 | 1.2 | Wet | 0 | PASS | 459 | 448 |

TABLE 7

<Photosensitivity test>

| | PI precursor or soluble PI | Hydrophilic solvent | Hydrophobic solvent | Content of hydrophilic solvent in dry film (wt %) | Content of hydrophobic solvent in dry film (wt %) | Hydrophilic solvent/ hydrophobic solvent | Lamination method | Exposure energy | L/S (μm) | Via (μm) |
|---|---|---|---|---|---|---|---|---|---|---|
| Example 3-6 | PAA-1 | NMP | NOP | 26.8 | 28.5 | 0.94 | Dry | 150 | 60 | 60 |
| Example 3-6 | PAA-1 | NMP | NOP | 26.8 | 28.5 | 0.94 | Wet | 50 | 60 | 60 |
| Example 2-4 | PAA-4 | NMP | DMC | 17.1 | 35.2 | 0.49 | Dry | 250 | 60 | 60 |
| Example 2-4 | PAA-4 | NMP | DMC | 17.1 | 35.2 | 0.49 | Wet | 100 | 60 | 60 |
| Example 1-16 | SPI-4 | NMP | NOEP | 12.1 | 46.3 | 0.26 | Dry | 200 | 60 | 60 |
| Example 1-16 | SPI-4 | NMP | NOEP | 12.1 | 46.3 | 0.26 | Wet | 100 | 60 | 60 |

Table 1 shows the effect without the addition of hydrophobic solvents or with the addition of different hydrophobic solvents. It can be known from Table 1 that if only a solvent (e.g. NMP) commonly used in the preparation of a conventional polyimide precursor or soluble polyimide is used, the resulting polyimide resin would be adhered to the release film in a great amount, such that it is difficult to use such in the subsequent processing process. Addition of a hydrophobic solvent can alleviate the stickiness and provide good transferability and water absorbability. Therefore, the resulting dry film is applicable to a wet lamination process.

Table 2 shows that by selecting a specific hydrophilic solvent to be used with the hydrophobic solvent and controlling the ratio thereof in a range given in the present invention, the resulting dry film is non-sticky, has good transferability and water absorbability, and is thus applicable to a wet lamination process.

Table 3 shows that when the weight ratio of the hydrophilic solvent to the hydrophobic solvent is too high (for example, above 2), the dry film is too sticky and cannot be used, and the storage stability of the dry film is poor (see Bendability test 3). When the weight ratio of the hydrophilic solvent to the hydrophobic solvent is too low (for example, less than 0.05), although the storage stability is increased, the transferability and water absorbability of the dry film are poor. The results in Table 3 show that by using a proper weight ratio of the hydrophilic solvent to the hydrophobic solvent (for example 0.05-2, and preferably 0.1-1), the resulting dry film has anti-stick performance and excellent transferability and water absorbability, the storage stability of the dry film is good (see Bendability test 3), and the polyimide layer formed subsequently also has excellent physical properties (see Bendability test 1).

Table 4 shows that the process stability (see Bendability test 4) and water absorbability of the dry film can be increased by adding a suitable amount of stabilizer, without affecting the physical properties of the polyimide layer obtained subsequently (see Bendability test 1).

Table 5 shows that when the total content of the solvents in the dry film is in the range of 30 to 70 wt %, the stickiness, transferability, and water absorbability of the dry film are better, and even in the presence of water, the final polyimide layer also has good physical properties (see Bendability test 1). When the total content of the solvents is below 30 wt %, the dry film fails to pass the transferability test, the water absorbability is worse, and the physical property of the final polyimide layer is poor (see Bendability test 1). When the total content of the solvents is above 70 wt %, the dry film is too sticky and cannot be used in a subsequent processing process.

Tables 6 and 7 show that the dry film of the present invention is applicable to a wet lamination process, no bubbles are left between the patterned surface and the polyimide resin layer, and the resulting polyimide layer has good physical properties. In addition, compared with the dry lamination process, the same resolution can be achieved with low exposure energy by using the dry film of the present invention in combination with the wet lamination process.

The above-described embodiments of the present invention are intended to be illustrative only, but are not to limit the present invention. A person of ordinary skill in the art would understand that modification can be made to the above-described embodiments or a part of or the whole technical features may be replaced with equivalents. Such modification and replacement do not depart from the scope of the invention.

What is claimed is:

1. A method for applying a dry film onto a patterned substrate by wet lamination, wherein
   (a) the dry film comprises a carrier and a polyimide layer, the polyimide layer comprises (i) a polyimide precursor or soluble polyimide and (ii) a solvent, and the solvent comprises a hydrophilic solvent and a hydrophobic solvent with a weight ratio of the hydrophilic solvent to the hydrophobic solvent being in a range of about 0.05 to about 2; and
   (b) the method comprises the step of laminating the dry film onto the patterned substrate with the polyimide layer facing the patterned substrate to form a laminate, wherein prior to the laminating step a liquid is applied onto a surface of the patterned substrate, wherein the liquid consists essentially of is water, an alcohol solvent or a combination thereof, and wherein the patterned substrate comprises a printed circuit board, a wafer, a display or a touch panel.

2. The method according to claim 1, wherein the weight ratio of the hydrophilic solvent to the hydrophobic solvent is in the range of about 0.1 to about 1.

3. The method according to claim 1, wherein the weight ratio of the hydrophilic solvent to the hydrophobic solvent is in the range of about 0.25 to about 0.8.

4. The method according to claim 1, wherein the content of the solvent is in the range of about 30 wt % to about 70 wt %, based on the total weight of the polyimide layer.

5. The method according to claim 1, wherein the hydrophilic solvent comprises dimethyl sulfoxide, diethyl sulfoxide, N,N-dimethyl-formamide, N,N-diethyl-formamide, N,N-dimethylacetamide, N,N-diethylacetamide, N-methyl-2-pyrrolidone, N-ethyl-2-pyrrolidone, N-propyl-2-pyrrolidone, N-vinyl-2-pyrrolidone, phenol, o-cresol, m-cresol, p-cresol, xylenol, halogenated phenol, pyrocatechol, tetrahydrofuran, dioxane, dioxolane, propylene glycol monomethyl ether, tetraethylene glycol dimethyl ether, 2-butoxyethanol, γ-butyrolactone, xylene, toluene, hexamethylphosphoramide, propylene glycol monomethyl ether acetate, or a mixture thereof.

6. The method according to claim 1, wherein the hydrophobic solvent comprises:

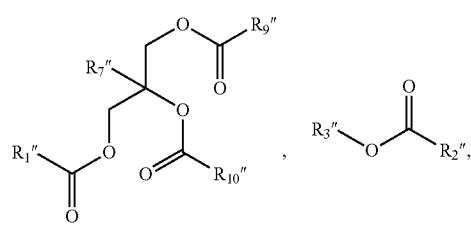

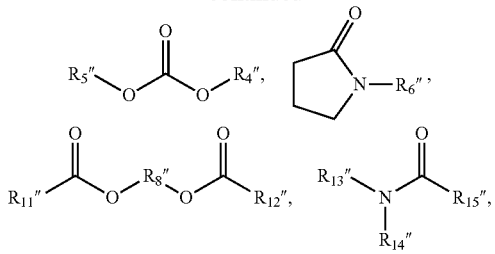

or a combination thereof,
wherein:
$R_1''$, $R_9''$, and $R_{10}''$ each independently represent $C_1$-$C_{20}$ alkyl, $C_2$-$C_{20}$ alkenyl, or $C_2$-$C_{20}$ alkynyl;
$R_7''$ is H or $C_1$-$C_3$ alkyl;
$R_2''$ is $C_1$-$C_{10}$ alkyl;
$R_3''$ is $C_4$-$C_{20}$ alkyl or —$C_2$-$C_{10}$ alkyl-O—$C_2$-$C_{10}$ alkyl;
$R_4''$ and $R_5''$ each independently represent $C_1$-$C_{10}$ alkyl, or $R_4''$ and $R_5''$, together with the oxygen atoms to which they are attached, form a 5 to 6-membered heterocyclic ring;
$R_6''$ is $C_4$-$C_{15}$ alkyl, $C_4$-$C_8$ cycloalkyl or

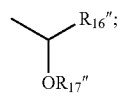

$R_8''$ is $C_2$-$C_{10}$ alkylene;
$R_{11}''$ and $R_{12}''$ each independently represent $C_1$-$C_{10}$ alkyl;
$R_{13}''$ and $R_{14}''$ each independently represent $C_1$-$C_{10}$ alkyl, or $R_{13}''$ and $R_{14}''$, together with the nitrogen atom to which they are attached, form a 5 to 6-membered heterocyclic ring;
$R_{15}''$ is $C_4$-$C_{15}$ alkyl or $C_4$-$C_8$ cycloalkyl;
$R_{16}''$ is $C_1$-$C_4$ alkyl; and
$R_{17}''$ is $C_4$-$C_{10}$ alkyl.

7. The method according to claim 6, wherein the hydrophobic solvent comprises

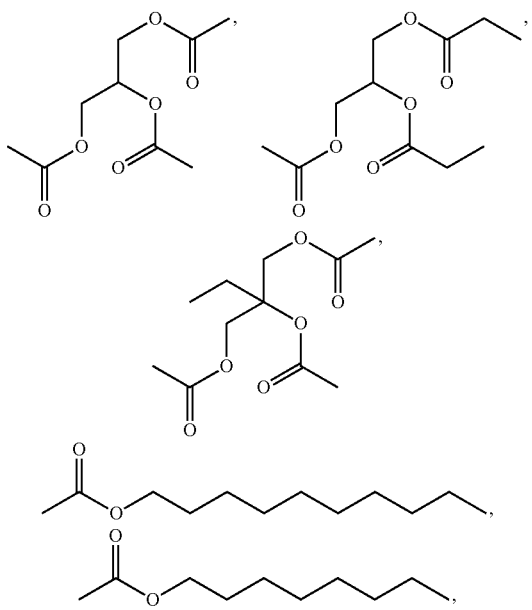

-continued

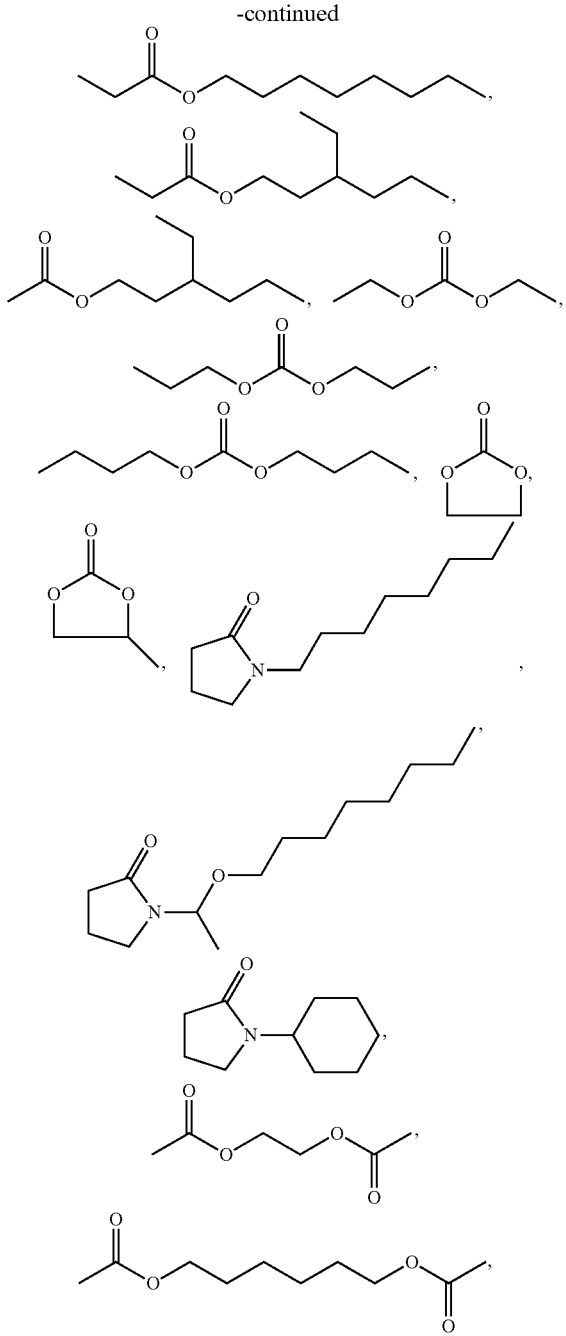

N,N-dimethylcapramide or a combination thereof.

8. The method according to claim 1, wherein the polyimide layer further comprises an additive, wherein the additive comprises a stabilizer, a ring closing promoter, a pigment, a leveling agent, a deforming agent, a coupling agent, a catalyst, an acrylate monomer, a photoinitiator or a combination thereof.

9. A method for applying a dry film onto a substrate by wet lamination, wherein
  (a) the dry film comprises a carrier and a polyimide layer, the polyimide layer comprises (i) a polyimide precursor or soluble polyimide and (ii) a solvent, and the solvent comprises a hydrophilic solvent and a hydrophobic solvent with a weight ratio of the hydrophilic solvent to the hydrophobic solvent being in a range of about 0.05 to about 2, wherein the polyimide layer further comprises an additive and the additive comprises a stabilizer, a ring closing promoter, a pigment, a leveling agent, a deforming agent, a coupling agent, a catalyst, an acrylate monomer, a photoinitiator or a combination thereof; and
  (b) the method comprises the step of laminating the dry film onto the substrate with the polyimide layer facing the substrate to form a laminate wherein the stabilizer comprises

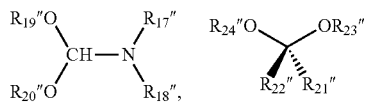

or a combination thereof
wherein
  $R_{17}''$, $R_{18}''$, $R_{19}''$, and $R_{20}''$ each independently represent H, $C_1$-$C_4$ alkyl or $C_6$-$C_{14}$ aryl, or $R_{19}''$ and $R_{20}''$, together with the oxygen atoms to which they are attached, form a 5 to 6-membered heterocyclic ring, or $R_{19}''$ and $R_{17}''$ or $R_{20}''$ and $R_{18}''$, together with the oxygen atom and nitrogen atom to which they are attached, form a 5 to 6-membered heterocyclic ring, or $R_{17}''$ and $R_{18}''$, together with the nitrogen atom to which they are attached, form a 5 to 6-membered heterocyclic ring;
  $R_{21}''$ and $R_{22}''$ each independently represent $C_1$-$C_4$ alkyl, or $R_{21}''$ and $R_{22}''$, together with the carbon atom to which they are attached, form a 5 to 6-membered carbocyclic ring; and
  $R_{23}''$ and $R_{24}''$ each independently represent $C_1$-$C_4$ alkyl.

10. The method according to claim 1, comprising a further step of letting the laminate stand for 5 to 240 minutes after the laminating step.

11. The method according to claim 1, wherein prior to the laminating step the polyimide precursor or the soluble polyimide is formed on the carrier as a film and not as a liquid material.

12. The method according to claim 1, wherein the method consists essentially of the laminating step and the liquid consists of water, an alcohol solvent or a combination thereof.

* * * * *